(12) United States Patent
Nagai et al.

(10) Patent No.: US 9,438,230 B2
(45) Date of Patent: Sep. 6, 2016

(54) GATE DRIVE CIRCUIT

(71) Applicant: Panasonic Intellectual Property Management Co., Ltd., Osaka (JP)

(72) Inventors: Shuichi Nagai, Osaka (JP); Yasufumi Kawai, Osaka (JP); Daisuke Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/690,426

(22) Filed: Apr. 19, 2015

(65) Prior Publication Data

US 2015/0222263 A1 Aug. 6, 2015

Related U.S. Application Data

(63) Continuation of application No. PCT/JP2014/003485, filed on Jul. 1, 2014.

(30) Foreign Application Priority Data

Jul. 30, 2013 (JP) ................................. 2013-158373

(51) Int. Cl.
| | |
|---|---|
| *H03K 17/06* | (2006.01) |
| *H03K 17/689* | (2006.01) |
| *H03K 17/16* | (2006.01) |
| *H03K 17/691* | (2006.01) |
| *H03K 17/687* | (2006.01) |
| *H02M 1/08* | (2006.01) |

(52) U.S. Cl.
CPC .......... *H03K 17/689* (2013.01); *H03K 17/163* (2013.01); *H03K 17/165* (2013.01); *H03K 17/6877* (2013.01); *H03K 17/691* (2013.01); *H02M 1/08* (2013.01); *H03K 2217/009* (2013.01)

(58) Field of Classification Search
USPC ......... 327/109, 374, 376–377, 379, 383–384
See application file for complete search history.

(56) References Cited

U.S. PATENT DOCUMENTS 8,847,663 B2 * 9/2014 Nagai ..................... H02M 1/08
                                                    327/374
8,866,516 B2    10/2014 Nagai et al.

FOREIGN PATENT DOCUMENTS

| JP | 2003-299344 | 10/2003 |
| JP | 2006-280100 | 10/2006 |

(Continued)

OTHER PUBLICATIONS

International Search Report of PCT application No. PCT/JP2014/003485 dated Sep. 9, 2014.

*Primary Examiner* — An Luu
(74) *Attorney, Agent, or Firm* — McDermott Will & Emery LLP

(57) ABSTRACT

A gate drive circuit in an aspect of the present disclosure includes a modulated signal generation circuit that generates a first modulated signal, a first isolator that isolatedly transmits the first modulated signal, and a first rectifier circuit that generates a first output signal by rectifying the first modulated signal. The first modulated signal includes a first amplitude, a second amplitude larger than the first amplitude, and a third amplitude larger than the second amplitude. The first output signal includes a first output voltage value according to the first amplitude, a second output voltage value according to the second amplitude, and a third output voltage value according to the third amplitude.

20 Claims, 11 Drawing Sheets

(56) References Cited

FOREIGN PATENT DOCUMENTS

| | | |
|---|---|---|
| JP | 2007-037255 | 2/2007 |
| JP | 2008-067012 | 3/2008 |
| JP | 2008-277484 | 11/2008 |
| JP | 2009-050118 | 3/2009 |
| JP | 2011-200037 | 10/2011 |
| JP | 2011-244185 | 12/2011 |
| JP | 2012-060514 | 3/2012 |
| JP | 2012-165341 | 8/2012 |
| WO | 2013/065254 | 5/2013 |

* cited by examiner

RINGING

NO RINGING

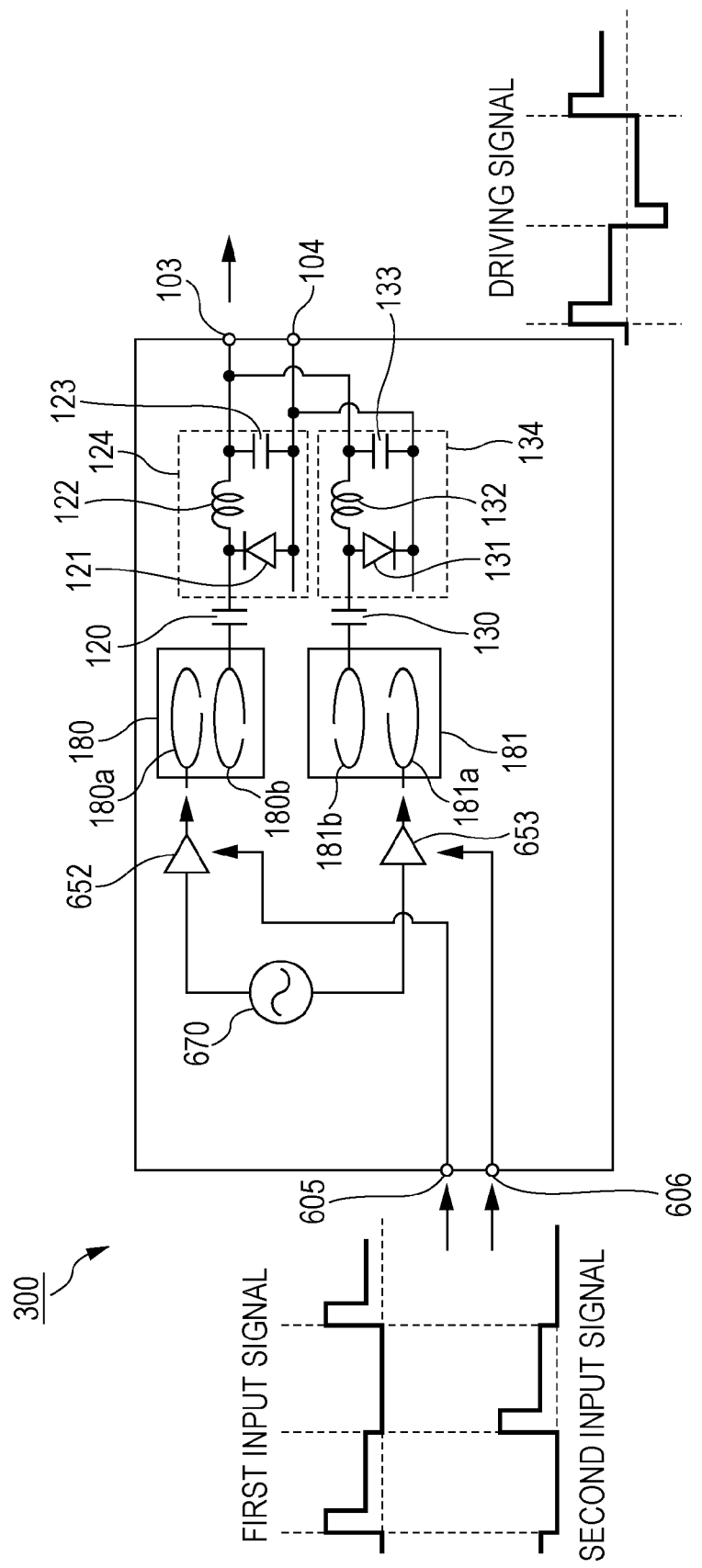

GATE DRIVE CIRCUIT

BACKGROUND

1. Technical Field

The present disclosure relates to a gate drive circuit that drives a semiconductor switch.

2. Description of the Related Art

A gate drive circuit for a semiconductor switching element (also referred to simply as a switching element) applies a gate voltage to the gate terminal of the switching element to control its on and off states. This control may be referred to below simply as gate driving. The gate drive circuit controls the on and off states of a high-voltage switching element such as, for example, an insulated gate bipolar transistor (IGBT), which is a type of power device.

In a gate drive circuit for this type of power device, a reference voltage on the output side connected to the switching element is very high. Therefore, a direct-current component needs to be isolated between a primary side, into which a control signal is entered, and a secondary side, from which a gate voltage is output to the switching element. In other words, signal ground needs to be isolated.

An electric circuit element that can isolate the direct-current component between the primary side and secondary side may be referred to as a signal isolator. The signal isolator is essential to the driving of a power device. The signal isolator isolates logic ground and radio-frequency (RF) ground from each other.

To drive a switching element, which is a power device, an isolated power supply unit is required separately. The isolated power supply unit may cause a circuit size to be increased. If the gate drive circuit enables not only a gate signal but also a gate power to be isolatedly supplied to the gate of the switching element, an external isolated power supply unit becomes unnecessary, enabling the gate drive circuit to be made compact.

Japanese Unexamined Patent Application Publication No. 2008-067012 discloses an electric power transmission system, as illustrated in FIG. 1, in which an open-ring resonator is used as a signal isolator.

SUMMARY

There is a need for a gate drive circuit capable of outputting a driving signal matching the characteristics of the switch.

One non-limiting and exemplary embodiment provides a gate drive circuit that can generate a driving signal having a given voltage waveform.

A gate drive circuit according to one aspect of the present disclosure includes: a modulated signal generation circuit that modulates a radio-frequency wave, to generate a first modulated signal including a first amplitude, a second amplitude larger than the first amplitude, and a third amplitude larger than the second amplitude; a first isolator that isolatedly transmits the first modulated signal; and a first rectifier circuit that rectifies the first modulated signal which has been transmitted by the first isolator, to generate a first output signal including a first output voltage value according to the first amplitude, a second output voltage value according to the second amplitude, and a third output voltage value according to the third amplitude, wherein the gate drive circuit that outputs a driving signal including at least part of the first output signal, to drive a semiconductor switch.

According to the gate drive circuit according to the present disclosure, it is possible to generate a driving signal having a given voltage waveform.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 11 illustrates an example of the structure of a gate drive circuit according to a third embodiment.

DETAILED DESCRIPTION

Underlying Knowledge Forming Basis of the Present Disclosure

In a typical conventional gate drive circuit, a signal that takes two voltage values, one of which causes a semiconductor switching element to be turned on and the other of which causes the semiconductor switching element to be turned off, has been applied to the gate terminal of the semiconductor switching element.

If the gate drive circuit can apply a driving signal having a voltage waveform matching the characteristics of the switching element to the gate terminal thereof, the switching element can be more efficiently driven.

Figure 1:
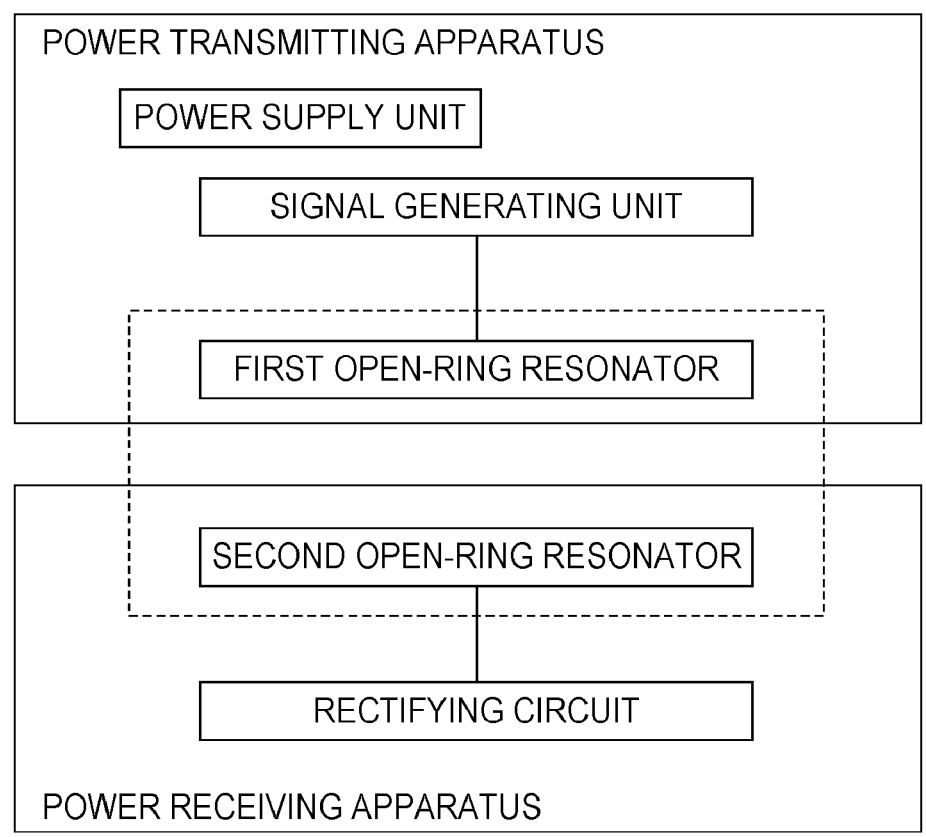
FIG. 1 is a block diagram illustrating the structure of a conventional signal transmission system.
Figure 2:
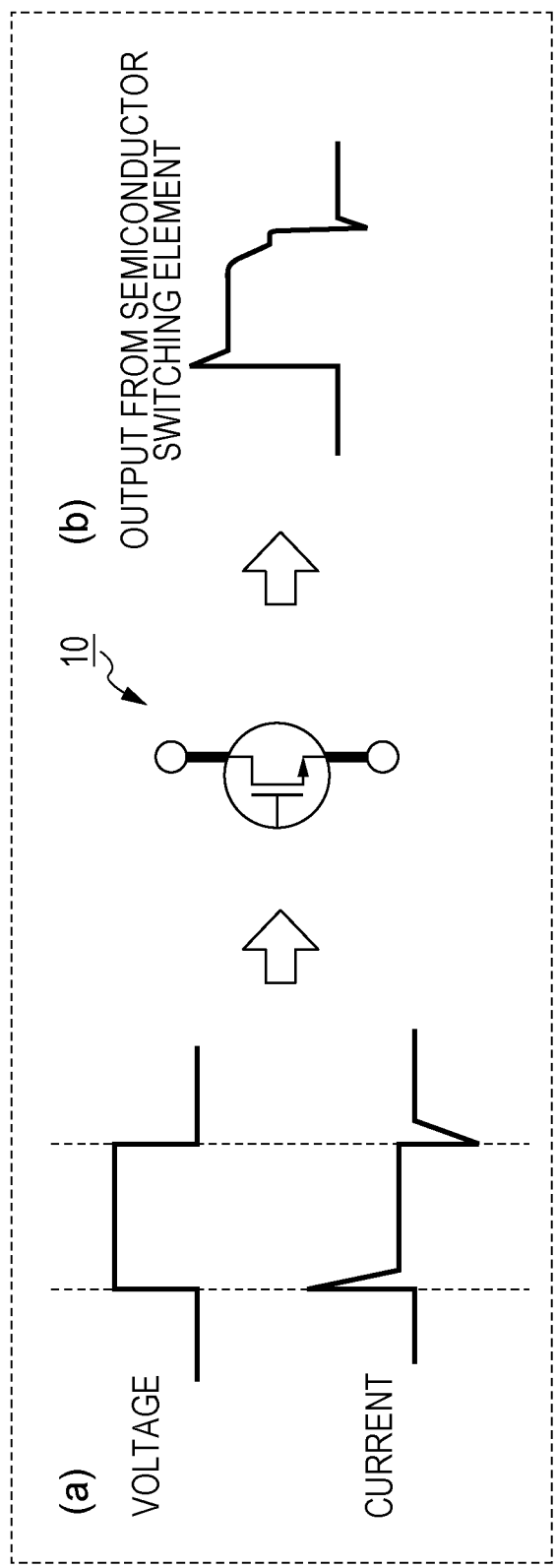
FIG. 2 illustrates an example of a relationship between voltage and current at a time when the gate of a semiconductor switching element is driven.
Figure 3:
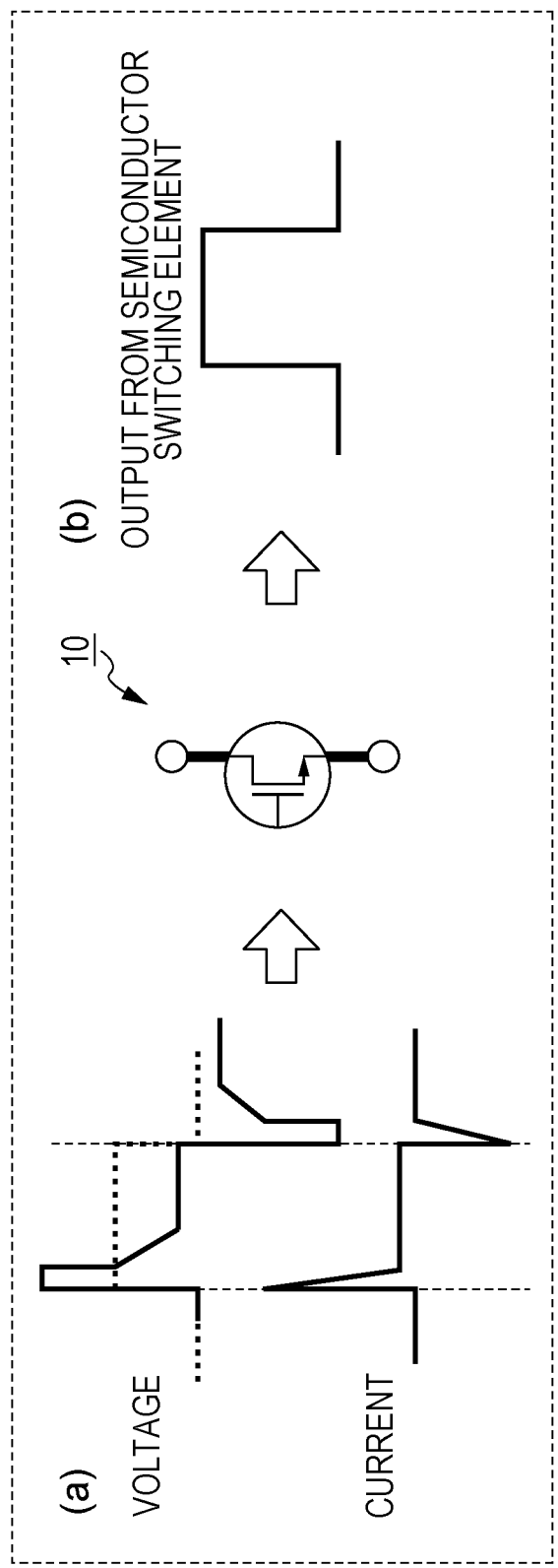
FIG. 3 illustrates another example of a relationship between voltage and current at a time when the gate of the semiconductor switching element is driven.

FIGS. 2 and 3 each illustrate an example of a relationship between voltage and current at a time when the gate of a switching element, which is a power device, is driven. In FIGS. 2 and 3, a high-level voltage is applied to the gate terminal of the switching element 10, which is an n-channel switching element, to turn on the switching element 10.

Typically, a high-level voltage is applied to the gate terminal of the switching element 10 in a period in which the switching element 10 is turned on, as illustrated in (a) in FIG. 2.

To switch the switching element 10 from the off state to the on state, a large current that supplies plenty of charges to a gate capacitor is required, as illustrated in (a) in FIG. 2. On the other hand, a current required to maintain the switching element 10 in the on state after that is small.

To switch the switching element from the on state to the off state, a large current is required to draw plenty of charges from the gate capacitor. On the other hand a current required to maintain the switching element 10 in the off state after that is small.

To reduce power consumption of the gate drive circuit, it is ideal for a driving signal having a voltage waveform as illustrated in (a) in FIG. 3 to be applied to the switching element, for example. In this case, a gate drive circuit that restrains power consumption can be implemented.

If a driving signal has a voltage waveform as illustrated in (a) in FIG. 2, electric power may become insufficient when the switching element 10 is turned on. Conversely, too much electric power may be supplied when the switching element 10 is turned off. In this case, the waveform of output power from the switching element 10 may include noise as illustrated in (b) in FIG. 2. Here, in FIG. 2, effects of a load connected to the switching element 10 are not considered.

In contrast, if a driving signal has a voltage waveform in which the absolute value of the voltage value is adequately large immediately after a rising edge and a falling edge thereof, as illustrated in (a) in FIG. 3, the noise in the waveform of output power from the switching element 10 can be reduced, as illustrated in (b) in FIG. 3.

The conventional isolated gate drive circuit has been controlling the on/off state of the switching element with optical couplers or the like. Therefore, it has been not possible to generate a driving signal having a voltage waveform indicating three or more voltage values as illustrated in (a) in FIG. 3.

In the conventional isolated gate drive circuit, the primary side and secondary side are isolated from each other through a transformer, which is a type of electromagnetic inductive coupler. In this case, the accumulation of energy in the transformer hinders the high-speed variation in the voltage value of the driving signal as illustrated in (a) in FIG. 3.

In view of the above situation, the inventors considered a gate drive circuit that can generate a driving signal having a given voltage waveform and can apply the signal to a switching element, which led to the present disclosure.

Overview of Embodiments

A gate drive circuit in an aspect of the present disclosure comprises: a modulated signal generation circuit that modulates a radio-frequency wave, to generate a first modulated signal including a first amplitude, a second amplitude larger than the first amplitude, and a third amplitude larger than the second amplitude; a first isolator that isolatedly transmits the first modulated signal; and a first rectifier circuit that rectifies the first modulated signal which has been transmitted by the first isolator, to generate a first output signal including a first output voltage value according to the first amplitude, a second output voltage value according to the second amplitude, and a third output voltage value according to the third amplitude, wherein the gate drive circuit that outputs a driving signal including at least part of the first output signal, to drive a semiconductor switch.

The gate drive circuit can perform contactless transmission of a signal having three or more values from the primary side to the secondary side through modulation of the radio-frequency wave, contactless transmission, and demodulation by rectification. Thus, the gate drive circuit can generate a driving signal having a given voltage waveform matching the characteristics of the switch.

In the gate drive circuit in an aspect of the present disclosure, for example, a driving signal may take three or more voltage values including a second output voltage value and a third output voltage value. This enables the gate drive circuit to drive a semiconductor switch by using a driving voltage having three or more voltage values and thus to, for example, reduce switching noise.

In the driving signal, for example, the driving signal may take the third output voltage value in a first on period, which begins when the semiconductor switch is turned on and may take the second output voltage value in a second on period, which follows the first on period.

When the semiconductor switch is turned on, a voltage having a large absolute value can be applied. In the subsequent period, a voltage having a relatively small absolute value can be applied. Therefore, efficient switching can be achieved and power consumption can be reduced.

In the gate drive circuit in an aspect of the present disclosure, for example, the modulated signal generation circuit may modulate the radio-frequency wave, further to generate a second modulated signal. The gate drive circuit may further include a second isolator that isolatedly transmits the second modulated signal, and a second rectifier circuit that rectifies the second modulated signal which has been transmitted by the second isolator, to generate a second output signal. The second modulated signal may include a fourth amplitude, a fifth amplitude, which is larger than the fourth amplitude, and a sixth amplitude, which is larger than the fifth amplitude. The second output signal may include a fourth output voltage value according to the fourth amplitude, a fifth output voltage value according to the fifth amplitude, and a sixth output voltage value according to the sixth amplitude. The driving signal may include at least part of the first output signal and at least part of the second output signal. In this case, for example, the driving signal may include the second output voltage value, third output voltage value, fifth output voltage value, and sixth output voltage value. Since the first modulated signal having three or more values and the second modulated signal having three or more values are combined, a driving signal having a given voltage waveform can be generated.

In the gate drive circuit in an aspect of the present disclosure, for example, the driving signal may take the sixth output voltage value in a first off period, which begins when the semiconductor switch is turned off and may take the fifth output voltage value in a second off period, which follows the first off period.

When the semiconductor switch is turned off, a voltage having a large absolute value can be applied. In the subsequent period, a voltage having a relatively small absolute value can be applied. Therefore, efficient switching can be achieved and power consumption can be reduced.

In the gate drive circuit in an aspect of the present disclosure, for example, the modulated signal generation circuit may modulates the radio-frequency wave to generate a first partially modulated signal and then may modulate the first partially modulated signal to generate the first modulated signal. For example, the modulated signal generation circuit may modulate the radio-frequency wave by partially amplifying part of an amplitude of the radio-frequency wave. For example, the modulated signal generation circuit may modulate the first partially modulated signal by amplifying part of an amplitude of the first partially modulated signal.

Since the radio-frequency wave is modulated at two stages, the first modulated signal having three or more values can be generated.

In the gate drive circuit in an aspect of the present disclosure, for example, the modulated signal generation circuit may include a first amplifier circuit and a modulator circuit. The first amplifier circuit may amplify part of an amplitude of the radio-frequency wave in a first amplifying period, to generate a first partially modulated signal, The modulator circuit may modulate the first partially modulated signal on the basis of an input signal, to generate the first modulated signal.

In the gate drive circuit in an aspect of the present disclosure, for example, the modulator circuit may further modulate the first partially modulated signal on the basis of an inversion signal of the input signal, to generate a second modulated signal. The gate drive circuit may further include a second isolator and a second rectifier circuit. The second isolator may isolatedly transmit the second modulated signal. The second rectifier circuit may rectify the second modulated signal which has been transmitted by the second isolator, to generate a second output signal. The driving signal may further include at least part of the second output signal. Thus, the first modulated signal and second modulated signal can be used as complementary signals. This enables the gate drive circuit to generate a driving signal by appropriately combining the first modulated signal and second modulated signal.

In the gate drive circuit in an aspect of the present disclosure, for example, the modulated signal generation circuit may include a first amplifier circuit and a modulator circuit. The modulator circuit may modulate the radio-frequency wave on the basis of a input signal to generate a first partially modulated signal. The first amplifier circuit may amplify an amplitude of the first partially modulated signal in a first amplifying period, to generate the first modulated signal.

In the gate drive circuit in an aspect of the present disclosure, for example, the modulator circuit may modulate the radio-frequency wave on the basis of an inversion signal of the input signal, to generate a second partially modulated signal. The modulator circuit may further include a second amplifier circuit. The second amplifier circuit may amplify part of an amplitude of the second partially modulated signal in a second amplifying period, to generate a second modulated signal. The gate drive circuit may further include a second isolator and a second rectifier circuit. The driving signal further includes at least part of the second output signal. Thus, the first modulated signal and second modulated signal can be used as complementary signals. This enables the gate drive circuit to generate a driving signal by appropriately combining the first modulated signal and second modulated signal.

In the gate drive circuit in an aspect of the present disclosure, for example, the modulated signal generation circuit may modulates the radio-frequency wave on the basis of a first input signal, to generate the first modulated signal. The first input signal may include a first input voltage value, a second input voltage value, which is larger than the first input voltage value, and a third input voltage value, which is larger than the second input voltage value. The first modulated signal may include the first amplitude according to the first input voltage value, the second amplitude according to the second input voltage value, and the third amplitude according to the third input voltage value. Thus, the first input signal with an amplitude having three or more values can be generated by modulating a radio-frequency wave according to the first input signal having three or more input voltage values.

In the gate drive circuit in an aspect of the present disclosure, for example, the modulated signal generation circuit may include a first amplifier circuit. The first amplifier circuit may modulate the radio-frequency wave by amplifying part of an amplitude of the radio-frequency wave on the basis of the first input signal, to generate the first modulated signal.

In the gate drive circuit in an aspect of the present disclosure, for example, the modulated signal generation circuit may further modulate the radio-frequency wave on the basis of a second input signal, to generate a second modulated signal. The gate drive circuit may further include a second isolator, and a second rectifier circuit, The second input signal may include a fourth input voltage value, a fifth input voltage value, which is larger than the fourth input voltage value, and a sixth input voltage value, which is larger than the fifth input voltage value. The second modulated signal may include a fourth amplitude according to the fourth input voltage value, a fifth amplitude according to the fifth input voltage value, and a sixth amplitude according to the sixth input voltage value. The second output signal may include a fourth output voltage value according to the fourth amplitude, a fifth output voltage value according to the fifth amplitude, and a sixth output voltage value according to the sixth amplitude. The driving signal may include at least part of the first output signal and at least part of the second output signal.

In the gate drive circuit in an aspect of the present disclosure, for example, the modulated signal generation circuit may include a first amplifier circuit and a second amplifier circuit. The first amplifier circuit may modulate the radio-frequency wave by amplifying part of an amplitude of the radio-frequency wave on the basis of the first input signal, to generate the first modulated signal. The second amplifier circuit may modulates the radio-frequency wave by amplifying an amplitude of the radio-frequency wave on the basis of the second input signal, to generate the second modulated signal. Since the first modulated signal having three or more values and the second modulated signal having three or more values are combined, a driving signal having a given voltage waveform can be generated.

In the gate drive circuit in an aspect of the present disclosure, for example, at least one of an amplitude in a prescribed period immediately after a rising edge of the first modulated signal and an amplitude in a prescribed period immediately after a falling edge of the first modulated signal may have been increased by the first amplifier circuit. This enables an amplified voltage to be applied at least one of immediately after a rising edge and immediately after a falling edge at which much electric power is required. Thus, efficient switching can be achieved.

In the gate drive circuit in an aspect of the present disclosure, for example, a period indicating the third amplitude of the first modulated signal may have been subjected to amplification by the first amplifier circuit.

In the gate drive circuit in an aspect of the present disclosure, for example, the gate drive circuit may further include a first circuit that generates a first signal. The first amplifying period may be specified by the first signal. In this case, the first circuit may include a differential circuit that differentiates the input signal.

In the gate drive circuit in an aspect of the present disclosure, for example, the modulator circuit may include a mixer circuit that performs modulation by mixing the entered radio-frequency wave or first partially modulated signal with the input signal. Alternatively, for example, the modulator circuit may include a switch circuit that performs modulation by selectively outputting the entered radio-frequency wave or first partially modulated signal on the basis of the input signal. In the gate drive circuit in an aspect of the present disclosure, for example, the modulated signal generation circuit may further include a radio-frequency oscillator that generates the radio-frequency wave.

In the gate drive circuit in an aspect of the present disclosure, for example, the isolator may be an electromagnetic resonant coupler.

With the electromagnetic resonant coupler, even if the voltage value of the driving signal rapidly changes, the driving signal can be appropriately transmitted from the primary side to the secondary side. Thus, the gate drive circuit can generate a driving signal having a voltage waveform the voltage value of which rapidly changes according to the characteristics of the switch.

The gate drive circuit according to the present disclosure may be implemented as an integrated circuit.

Embodiments will be specifically described with reference to the drawings.

All embodiments described below illustrate comprehensive or specific examples. Numerals, shapes, materials, constituent elements, placement and connection forms of these constituent elements, steps, the sequence of these steps, and the like are only examples, and are not intended to restrict the present disclosure. Of the constituent elements in the embodiments below, constituent elements not described in an independent claim, which indicates the topmost concept, will be described as arbitrary constituent elements.

First Embodiment

A gate drive circuit according to a first embodiment will be described first.

The gate drive circuit according to the first embodiment includes a modulated signal generation circuit that generates a first modulated signal by modulating a radio-frequency wave, a first isolator that isolatedly transmits the first modulated signal, and a first rectifier circuit that generates a first output signal by rectifying the first modulated signal. The modulated signal generation circuit includes, for example, a first amplifier circuit that generates a first partially modulated signal by increasing the amplitude of the radio-frequency wave in a first amplifying period and a modulator circuit that generates the first modulated signal by modulating the first partially modulated signal according to an input signal entered into an input terminal.

Figure 4:
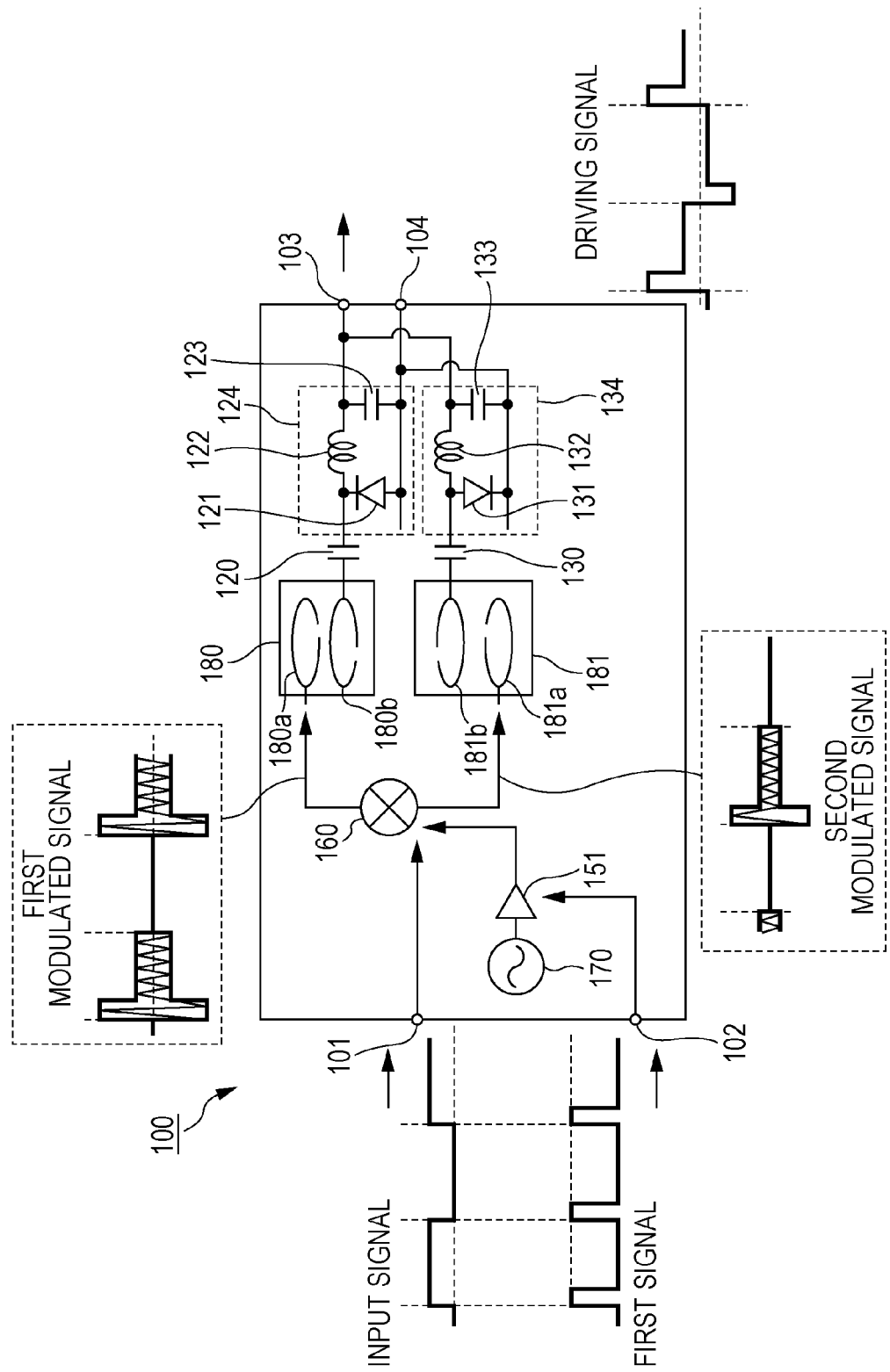
FIG. 4 illustrates an example of the structure of a gate drive circuit according to a first embodiment.

FIG. 4 illustrates an example of the structure of the gate drive circuit according to the first embodiment.

As illustrated in FIG. 4, the gate drive circuit 100 includes an input terminal 101, a gain input terminal 102, a radio-frequency oscillator 170, a first amplifier circuit 151, a mixer circuit 160, a first electromagnetic resonant coupler 180, a second electromagnetic resonant coupler 181, a first rectifier circuit 124, a second rectifier circuit 134, an output terminal 103, and an output reference terminal 104. The gate drive circuit 100 also includes an input capacitor 120 and an input capacitor 130. The mixer circuit 160 is an example of modulator circuit.

The gate drive circuit 100 generates a driving signal that drives a semiconductor switching element.

The input terminal 101 receives an input signal that drives the semiconductor switching element.

The gain input terminal 102 receives a first signal that indicates a target period. The target period indicates a period in which the first amplifier circuit 151 amplifies a radio-frequency wave, that is, a period in which the first amplifier circuit 151 operates.

For example, the target period is a period in which the voltage value of the first signal is at a high level. In contrast, a non-target period is period in which the voltage value of the first signal is at a low level. That is, if a period in which the gate drive circuit 100 drives the semiconductor switching element is defined as a control period, the non-target period is a period determined by removing the target period from the control period. If a signal to be modulated, including a radio-frequency component, has a period in which its amplitude is 0 V, even if the first amplifier circuit 151 attempts to increase the amplitude in that period, the amplitude in the period remains at 0 V.

The radio-frequency oscillator 170 generates a radio-frequency wave that is a carrier of the input signal entered into the input terminal 101. Here, the radio-frequency wave has a waveform at a frequency higher than the frequency of the input signal. The frequency of the radio-frequency wave is, for example, 100 MHz or higher. The radio-frequency wave has fixed amplitude and fixed frequency, for example.

With the radio-frequency wave, the gate drive circuit 100 can drive a switching element operating at very high speed.

For example, the gate drive circuit 100 may drive Gallium nitride (GaN) power transistor or other next-generation power device at high speed. A GaN power transistor, for example, can perform switching operation at 10 MHz. The gate drive circuit 100 may drive a GaN power transistor at 10 MHz by a driving signal at a frequency of 50 to 100 MHz, for example. In this case, the carrier is set to a higher frequency than the driving signal.

The frequency of the radio-frequency wave is, for example, about 2.4 GHz. In this case, the gate drive circuit 100 adequately enables a next-generation GaN power transistor to perform high-speed switching operation.

The first amplifier circuit 151 acquires a radio-frequency wave generated by the radio-frequency oscillator 170, amplifies the amplitude of the radio-frequency wave in a target period up to a value larger than the amplitude of the radio-frequency wave in a non-target period, and outputs the radio-frequency wave having the amplified amplitude. For example, the first amplifier circuit 151 acquires the first signal from the gain input terminal 102 and then performs amplification in the target period identified by the acquired first signal.

In other words, the amplification of the amplitude of a radio-frequency wave in a certain period is equivalent to the modulating of the amplitude of the radio-frequency wave. In the present disclosure, therefore, a signal generated by the first amplifier circuit may be referred to as the first partially modulated signal. That is, in the example in FIG. 4, the radio-frequency wave output from the first amplifier circuit 151 is an example of the first partially modulated signal. A period in which the amplitude of the radio-frequency wave is amplified may be also referred to as the first amplification period, which is an example of the target period.

The amplification of the amplitude of the radio-frequency wave in a target period up to a value larger than the amplitude of the radio-frequency wave in a non-target period is achieved by increasing only the amplitude of the radio-frequency wave in the target period and/or by decreasing the only the amplitude of the radio-frequency wave in a non-target period.

The target period covers, for example, both a prescribed period immediately after a rising edge of an input signal entered into the input terminal 101 and a prescribed period immediately after a falling edge of the input signal.

However, the target period is not limited to the above periods. For example, the target period may be one of a prescribed period immediately after a rising edge of the input signal entered into the input terminal 101 and a prescribed period immediately after a falling edge of the input signal. Alternatively, the target period may be set according to the characteristics of a semiconductor switching element connected to the output terminal 103 and output reference terminal 104 of the gate drive circuit 100.

To generate the first modulated signal, the mixer circuit 160 further modulates the radio-frequency wave output from the first amplifier circuit 151 according to the input signal entered from the input terminal 101. To generate the second modulated signal, the mixer circuit 160 also modulates the radio-frequency wave output from the first amplifier circuit 151, according to a signal generated by inverting the input signal entered from the input terminal 101. The input signal and the inverted input signal have a symmetric voltage waveform to each other with reference to a constant voltage. The reference voltage is, for example, 0 V. Alternatively, the reference voltage may be, for example, an intermediate value between the high level and low level of the input signal.

As illustrated in FIG. 4, the first modulated signal includes a first amplitude, a second amplitude, which is larger than the first amplitude, and a third amplitude, which is larger than the second amplitude. The second modulated signal may include a fourth amplitude, a fifth amplitude, which is larger than the fourth amplitude, and a sixth amplitude, which is larger than the fifth amplitude.

The first electromagnetic resonant coupler 180 isolatedly transmits the first modulated signal, which is a radio-frequency wave modulated with the input signal.

The second electromagnetic resonant coupler 181 isolatedly transmits the second modulated signal, which is a radio-frequency wave modulated with the input signal.

The first electromagnetic resonant coupler 180 and second electromagnetic resonant coupler 181 are each an open ring type of electromagnetic resonant coupler as described in, for example, Japanese Unexamined Patent Application Publication No. 2008-067012. For example, the first electromagnetic resonant coupler 180 includes two resonators 180a and 180b, which are of open ring type, and the second electromagnetic resonant coupler 181 includes two resonators 181a and 181b, which are of open ring type. Alternately, the first electromagnetic resonant coupler 180 and second electromagnetic resonant coupler 181 may have a rectangular loop shape or the like. The first electromagnetic resonant coupler 180 and second electromagnetic resonant coupler 181 may be any device that can isolatedly transmit a signal through electromagnetic resonance coupling.

The line length of the resonators 180a and 180b may be set to a half of the wavelength of a radio-frequency wave to be transmitted. Therefore, the higher the frequency of the radio-frequency wave to be transmitted is, the smaller the size of the resonators 180a and 180b is. If the first modulated signal is a radio-frequency signal having a radio-frequency component at, for example, about 2.4 GHz, the size of the first electromagnetic resonant coupler 180 is very small when compared with conventional signal isolators. This is also true for the line lengths of the resonators 181a and 181b. If the radio-frequency component of the second modulated signal is at, for example, about 2.4 GHz, the size of the second electromagnetic resonant coupler 181 is very small when compared with conventional signal isolators.

To generate the first output signal, the first rectifier circuit 124 acquires the first modulated signal, which has been transmitted from the primary side to the secondary side by the first electromagnetic resonant coupler 180, and rectifies and demodulates the first modulated signal. The first rectifier circuit 124, for example, includes a diode 121, an inductor 122, and a smoothing capacitor 123. In the example in FIG. 4, the first output signal has a positive voltage or 0 V with respect to the voltage at the output reference terminal 104. Therefore, the first rectifier circuit 124 may also be referred to as the positive-side rectifier circuit.

In the example in FIG. 4, the first output signal includes a first output voltage value according to the first amplitude of the first modulated signal, a second output voltage value according to the second amplitude of the first modulated signal, and a third output voltage value according to the third amplitude of the first modulated signal. If the first output voltage value, second output voltage value, and third output voltage are all 0 or positive, the first output voltage value, second output voltage value, and third output voltage value are larger in that order.

The primary side and secondary side described here are respectively the input side and output side of the first electromagnetic resonant coupler 180. In the example in FIG. 4, the first amplifier circuit 151, mixer circuit 160 and radio-frequency oscillator 170 are disposed on the primary side region with respect to the first electromagnetic resonant coupler 180, and the first rectifier circuit 124 is disposed on the secondary side region with respect to the first electromagnetic resonant coupler 180.

To generate the second output signal, the second rectifier circuit 134 acquires the second modulated signal, which has been transmitted from the primary side to the secondary side by the second electromagnetic resonant coupler 181, and rectifies and demodulates the second modulated signal. The second rectifier circuit 134, for example, includes a diode 131, an inductor 132, and a smoothing capacitor 133. In the example in FIG. 4, the second output signal has a negative voltage or 0 V with respect to the voltage at the output reference terminal 104. Therefore, the second rectifier circuit 134 may also be referred to as the negative-side rectifier circuit.

In the example in FIG. 4, the second output signal includes a fourth output voltage value according to the fourth amplitude of the second modulated signal, a fifth output voltage value according to the fifth amplitude of the second modulated signal, and a sixth output voltage value according to the sixth amplitude of the second modulated signal. If the fourth output voltage value, fifth output voltage value, and sixth output voltage are all 0 or negative, the fourth output voltage value, fifth output voltage value, and sixth output voltage value are smaller in that order.

The output terminal 103 and output reference terminal 104, which are paired, each output a driving signal including the first output signal and second output signal. In the driving signal, a signal in a period in which the voltage at the output terminal 103 is positive with respect to the voltage at the output reference terminal 104 may be composed of the first output signal, and a signal in a period in which the voltage at the output terminal 103 is negative with respect to the voltage at the output reference terminal 104 may be composed of the second output signal.

That is, in the example in FIG. 4, the driving signal includes part of the first output voltage and part of the second output voltage. For example, the driving signal includes the second output voltage value and third output voltage value of the first output voltage and the fifth output voltage value and sixth output voltage value of the second output voltage. In the driving signal in the example in FIG. 4, a period in which a voltage value is positive may be referred to as an on period and a period in which a voltage value is negative may be referred to as an off period. The driving signal takes the third output voltage value, which has a positive polarity and a large absolute value, in a first on period, which begins after a switchover from an off period to an on period. In a second on period, which follows the first on period, the driving signal takes the second output voltage value, which has a polarity and a small absolute value. The driving signal takes the sixth output voltage value, which has a negative polarity and a large absolute value, in a first off period, which begins after a switchover from an on period to an off period. In a second off period, which follows the first off period, the driving signal takes the fifth output voltage value, which has a negative polarity and a small absolute value.

In the gate drive circuit 100 in FIG. 4, the output terminal 103 is connected to the gate terminal of the semiconductor switching element and the output reference terminal 104 is connected to the source terminal of the semiconductor switching element.

In the description below, the semiconductor switching element connected to the output terminal 103 and output reference terminal 104 will be described as a gallium nitride (GaN) power transistor that is turned on when a gate voltage of 3 V is applied. However, any semiconductor switching element may be connected to the output terminal 103 and output reference terminal 104.

Although not illustrated in FIG. 4, a resistor may be inserted between the output terminal 103 and the output reference terminal 104.

Next, the features of the gate drive circuit 100 will be described.

The gate drive circuit 100 generates a driving signal according to the input signal entered into the input terminal 101. The driving signal gate-drives the semiconductor switching element connected to the output terminal 103 and output reference terminal 104. The input signal is, for example, a two-valued control signal.

The output reference terminal 104 gives the reference potential of the driving signal to the semiconductor switching element connected therewith. Since the output reference terminal 104 is isolated from the ground on the primary side by the first electromagnetic resonant coupler 180 and second electromagnetic resonant coupler 181, the output reference terminal 104 is in a floating state with respect to the ground on the primary side. In the description below, isolation means that the signal lines on the primary side and the signal lines on the secondary side are electrically isolated from each other in terms of direct current, and the ground on the primary side and the ground on the secondary side are electrically isolated from each other in terms of direct current.

That is, when an input signal is entered into the input terminal 101 on the primary side, the gate drive circuit 100 can output a driving voltage with a prescribed waveform to the output terminal 103 on the secondary side with respect to the voltage at the output reference terminal 104 isolated from the ground on the primary side.

The gate drive circuit 100 in the FIG. 4 can modulate, at a plurality of steps, the amplitude of the radio-frequency wave output from the radio-frequency oscillator 170, thereby generating the driving signal having a desired voltage waveform. For example, if the input signal entered into the input terminal 101 takes two voltage values, the gate drive circuit 100 can change the driving signal to a signal that takes three or more voltage values. That is, even if the input signal is a two-valued signal, the gate drive circuit 100 can generate a multi-valued driving signal that takes three or more voltage values.

As for electric power transmission using electromagnetic resonant couplers, even if there is a certain distance between these electromagnetic resonant couplers, highly efficient electric power transmission can be achieved. Therefore, the gate drive circuit 100 including electromagnetic resonant couplers can attain a high withstand voltage by prolonging the distance between the electromagnetic resonant couplers and can also achieve electric power transmission with a low loss.

In the gate drive circuit 100, the sizes of the first electromagnetic resonant coupler 180 and second electromagnetic resonant coupler 181 can be reduced by increasing the frequency of a radio-frequency wave.

Next, the operation of the gate drive circuit 100 will be described.

In the gate drive circuit 100, the radio-frequency wave generated by the radio-frequency oscillator 170 is entered into the first amplifier circuit 151.

The first signal entered into the gain input terminal 102 is entered into the first amplifier circuit 151. The first signal, for example, specifies both a period immediately after a rising edge of an input signal and a period immediately after a falling edge of the input signal, which are the target periods.

For example, as illustrated in FIG. 4, the first signal takes a positive voltage value, or high level, in a specific period immediately after a rising edge of the input signal and in a specific period immediately after a falling edge of the input signal, and takes 0V, or low level, in other periods.

The first amplifier circuit 151 amplifies the amplitude of the radio-frequency wave in the target period up to a value larger than the amplitude of the radio-frequency wave in a non-target period, and then outputs the radio-frequency wave having the partially amplified amplitude.

For example, the first amplifier circuit 151 may change the amount of amplification of the radio-frequency wave according to the first signal entered from the gain input terminal 102. While the first signal is at 0 V, the first amplifier circuit 151 does not substantially operate, so the amplitude of the radio-frequency wave is very small. The amount of amplification by the first amplifier circuit 151 varies depending on the voltage applied to the gain input terminal 102.

As illustrated in FIG. 4, when the radio-frequency wave is amplified by the first amplifier circuit 151 and then is mixed with a input signal by the mixer circuit 160, the amplitude of the radio-frequency wave in the target period becomes the third amplitude of the first modulated signal, which is a large absolute voltage value.

If the first amplifier circuit 151 has normally-off characteristic, the first amplifier circuit 151 operates only when the first signal is at a high level. In this case, a time during which the first amplifier circuit 151 operates can be shortened, reducing electric power consumed by the first amplifier circuit 151. If power consumption by the first amplifier circuit 151 occupies a large portion of the power consumption by the whole of the gate drive circuit 100, this structure can efficiently reduce power consumption.

The input signal entered into the input terminal 101 is entered into the mixer circuit 160. The mixer circuit 160 generates the first modulated signal by modulating the radio-frequency wave acquired from the first amplifier circuit 151, according to the input signal. In other words, the amplitude of the radio-frequency wave is modulated by the mixer circuit 160 according to the input signal entered from the input terminal 101.

A voltage waveform of the first modulated signal output from the mixer circuit 160 is similar to the voltage waveform of the radio-frequency wave that has been modulated according to a signal obtained by multiplexing an input voltage by the first signal.

To generate the second modulated signal, the mixer circuit 160 modulates the radio-frequency wave acquired from the first amplifier circuit 151, according to an inverted input signal generated by inverting the input signal entered from the input terminal 101. In other words, in addition to the first modulated signal, the mixer circuit 160 generates the second modulated signal, which is complementary to the first modulated signal.

The first modulated signal is entered into the first electromagnetic resonant coupler 180, and the second modulated signal is entered into the second electromagnetic resonant coupler 181. The first modulated signal is isolately transmitted from the primary side to the secondary side by the first electromagnetic resonant coupler 180, and then is entered to the first rectifier circuit 124 through the input capacitor 120. The second modulated signal is isolately transmitted from the primary side to the secondary side by the second electromagnetic resonant coupler 181, and then is entered to the second rectifier circuit 134 through the input capacitor 130.

As described above, the first rectifier circuit 124 includes the diode 121, inductor 122, and smoothing capacitor 123, for example.

The cathode of the diode 121 and one end of the inductor 122 are connected to the input end of the first rectifier circuit 124. One end of the smoothing capacitor 123 and the output terminal 103 are connected to the other end of the inductor 122. The anode of the diode 121 and the other end of the smoothing capacitor 123 are connected to the output reference terminal 104.

The first rectifier circuit 124 rectifies a portion, of the first modulated signal, that has a positive voltage value with respect to the output reference terminal 104, thereby generating the first output signal.

As described above, the second rectifier circuit 134 includes the diode 131, inductor 132, and smoothing capacitor 133, for example.

The anode of the diode 131 and one end of the inductor 132 are connected to the input end of the second rectifier circuit 134. One end of the smoothing capacitor 133 and the output terminal 103 are connected to the other end of the inductor 132. The cathode of the diode 131 and the other end of the smoothing capacitor 133 are connected to the output reference terminal 104.

The second rectifier circuit 134 rectifies a portion, of the first modulated signal, that has a negative voltage value with respect to the output reference terminal 104, thereby generating the second output signal.

The input capacitor 120 may be included in the first rectifier circuit 124, and the input capacitor 130 may be included in the second rectifier circuit 134.

To operate the diode 121 and diode 131 in a radio-frequency domain, a Schottky barrier diode or another diode with a small junction capacitance may be used as the diode 121 and diode 131.

If, for example, the radio-frequency wave is at 2.4 GHz, a GaN Schottky barrier diode may be used as the diode 121 and diode 131. For example, the inductor 122 and inductor 132 may have an inductance of 5.8 nH, and the input capacitor 120 and input capacitor 130 may have a capacitance of 0.4 pH. In this configuration, the first rectifier circuit 124 and second rectifier circuit 134 each operates can rectifies a modulated signal including a radio-frequency component at 2.4 GHz.

The first rectifier circuit 124 and second rectifier circuit 134 are not limited to these circuit structures. Any other circuit structures may be used if they can rectify a modulated signal to modulate it.

Figure 5:
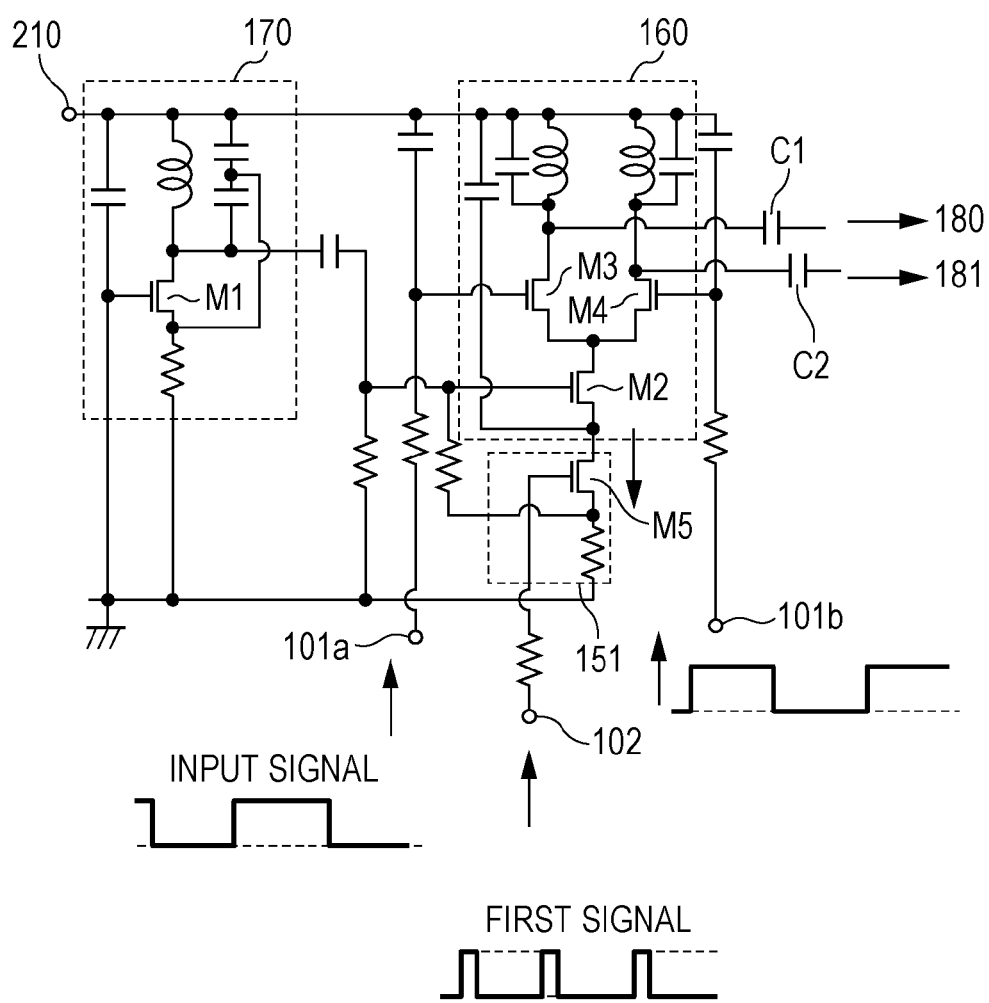
FIG. 5 illustrates an example of the circuit structure of a transmitting part in the gate drive circuit according to the first embodiment.

Next, the circuit structure of the transmitting part in the gate drive circuit 100 as structured in FIG. 4 will be specifically described with reference to FIG. 5. The transmitting part may be also referred to as a modulated signal generation circuit. FIG. 5 illustrates an example in which the modulated signal generation circuit includes the first amplifier circuit 151, mixer circuit 160, and radio-frequency oscillator 170.

FIG. 5 illustrates an example of the circuit structure of the transmitting part in the gate drive circuit 100. In the circuit in FIG. 5, it is assumed that an input signal is entered into an input terminal 101*a* and an inverted input signal is entered into an input terminal 101*b*. The inverted input signal may be generated by an invert circuit (not illustrated), which is provided separately.

A power supply unit for the transmitting part is connected to a power supply terminal 210.

In the example in FIG. 5, the radio-frequency oscillator 170, which is a so-called Colpitts oscillation circuit including a transistor Ml, generates a radio-frequency wave.

The mixer circuit 160 is an active mixer that includes transistors M2, M3, and M4. The radio-frequency wave output from the radio-frequency oscillator 170 is amplitude by the transistor M2. While the transistor M3 is in on state, the radio-frequency wave amplified by the transistor M2 is output to the first electromagnetic resonant coupler 180. While the transistor M4 is in on state, the radio-frequency wave amplified by the transistor M2 is output to the second electromagnetic resonant coupler 181.

In other words, the radio-frequency wave amplified by the transistor M2 is output to the first electromagnetic resonant coupler 180 when a positive voltage is applied to the input terminal 101*a,* and is output to the second electromagnetic resonant coupler 181 when a positive voltage is applied to the input terminal 101*b.*

At that time, the amount of amplification by the transistor M2 and its power consumption depend on the drain current of the transistor M2. In the transmitting part in FIG. 5, the intensity of the drain current flowing in the transistor M2 depends on the on-resistance of the transistor M5.

The transistor M5, for example, is switched between the on state and the off state depending on whether or not the first signal is entered from the gain input terminal 102 into the gate terminal of the transistor M5. When the resistance of the transistor M5 changes, the amount of the drain current flowing in the transistor M2 changes, causing the amount of amplification by the transistor M2 and its power consumption to be changed.

As a result, the first modulated signal and second modulated signal that have voltage waveforms as illustrated in FIG. 4 are output from the transmitting part.

Although not illustrated in FIG. 4, a capacitor C1 may be disposed between the mixer circuit 160 and the first electromagnetic resonant coupler 180 as illustrated in FIG. 5.

Similarly, a capacitor C2 may be disposed between the mixer circuit 160 and the second electromagnetic resonant coupler 181.

Figure 6:
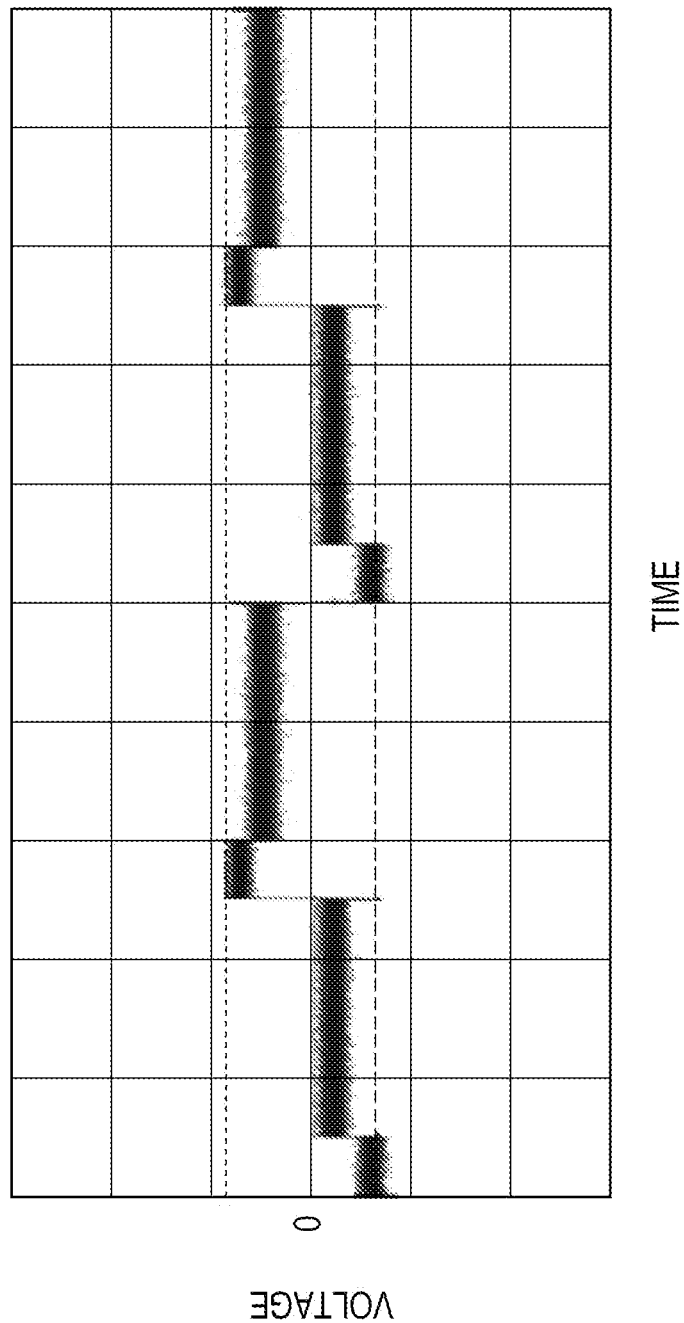
FIG. 6 illustrates an example of the voltage waveform of a driving signal output from the gate drive circuit according to the first embodiment.

The gate drive circuit 100 described above can output a driving signal having a voltage waveform as illustrated in FIG. 6. As illustrated in FIG. 6, the gate drive circuit 100 can apply a high voltage to a semiconductor switching element, or load, in periods corresponding to a period immediately after a rising edge of the input signal and a period immediately after a falling edge of the input signal.

Figure 7A:
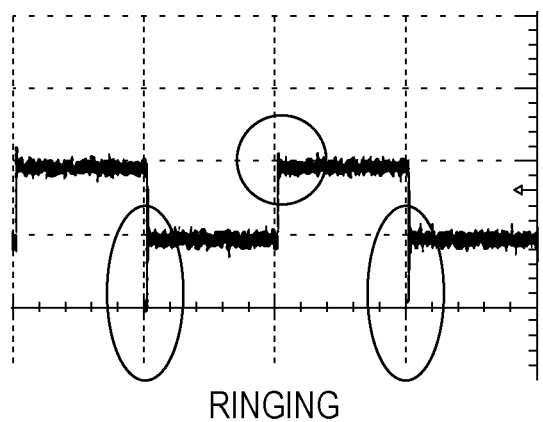
FIGS. 7A and 7B illustrate an example of the switching waveform of a semiconductor switching element driven by the gate drive circuit according to the first embodiment.
Figure 7B:
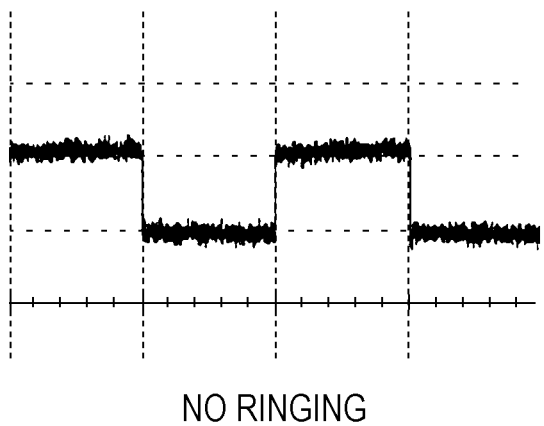

FIG. 7B illustrates an example of the switching waveform of a semiconductor switching element driven by the gate drive circuit 100.

FIG. 7A illustrates the switching waveform of a semiconductor switching element driven by a conventional gate drive circuit. As illustrated in FIG. 7A, the conventional gate drive circuit caused a large ringing to be occurred at each rising edge and each falling edge.

FIG. 7B illustrates the switching waveform of a semiconductor switching element driven by the gate drive circuit 100 in FIG. 4. As illustrated in FIG. 7A, the gate drive circuit 100 realized a superior voltage waveform that includes no ringing.

So far, the gate drive circuit 100 according to the first embodiment has been illustratively described. In the gate drive circuit 100, a modulated signal including a radio-frequency component is isolatedly transmitted from the primary side to the secondary side with the electromagnetic resonant couplers. Therefore, the gate drive circuit 100 can output a driving signal having voltage values that can be rapidly changed to given values.

Figure 8:
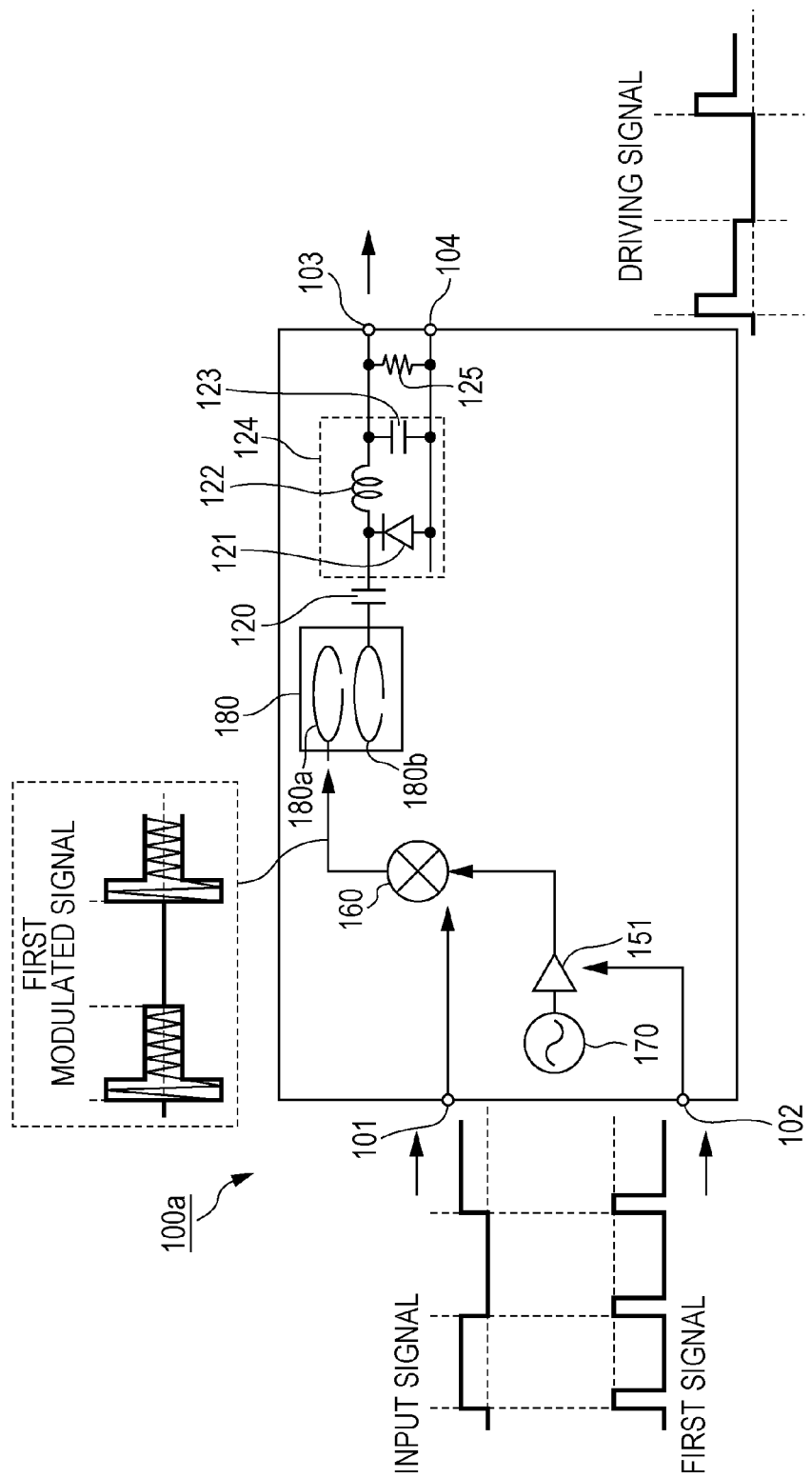
FIG. 8 illustrates an example of the structure of a gate drive circuit that lacks a second electromagnetic resonant coupler and other components.

The second electromagnetic resonant coupler 181, input capacitor 130, and second rectifier circuit 134 in the gate drive circuit 100 are not always mandatory constituent elements. The gate drive circuit in the present disclosure may be implemented as a gate drive circuit 100a as illustrated in FIG. 8. The gate drive circuit 100a can reduce power consumption when a semiconductor switching element is turned on, achieving efficient switching. If the gate drive circuit 100a includes a resistor 125, the gate drive circuit 100a can speed up the falling of the switching waveform when the semiconductor switching element is turned off.

As illustrated in FIG. 8, in the gate drive circuit 100a, the first modulated signal includes a first amplitude, a second amplitude, which is larger than the first amplitude, and a third amplitude, which is larger than the second amplitude. The first output signal includes a first output voltage value according to the first amplitude of the first modulated signal, a second output voltage value according to the second amplitude of the first modulated signal, and a third output voltage value according to the third amplitude of the first modulated signal. If the first output voltage value, second output voltage value, and third output voltage are all 0 or positive, the first output voltage value, second output voltage value, and third output voltage value are larger in that order. The driving signal includes the whole of the first output signal. For example, the driving signal includes the first output voltage value, second output voltage value, and third output voltage value of the first output signal.

In the gate drive circuit 100a, a switch circuit may be used as the modulator circuit, instead of the mixer circuit 160.

Figure 9:
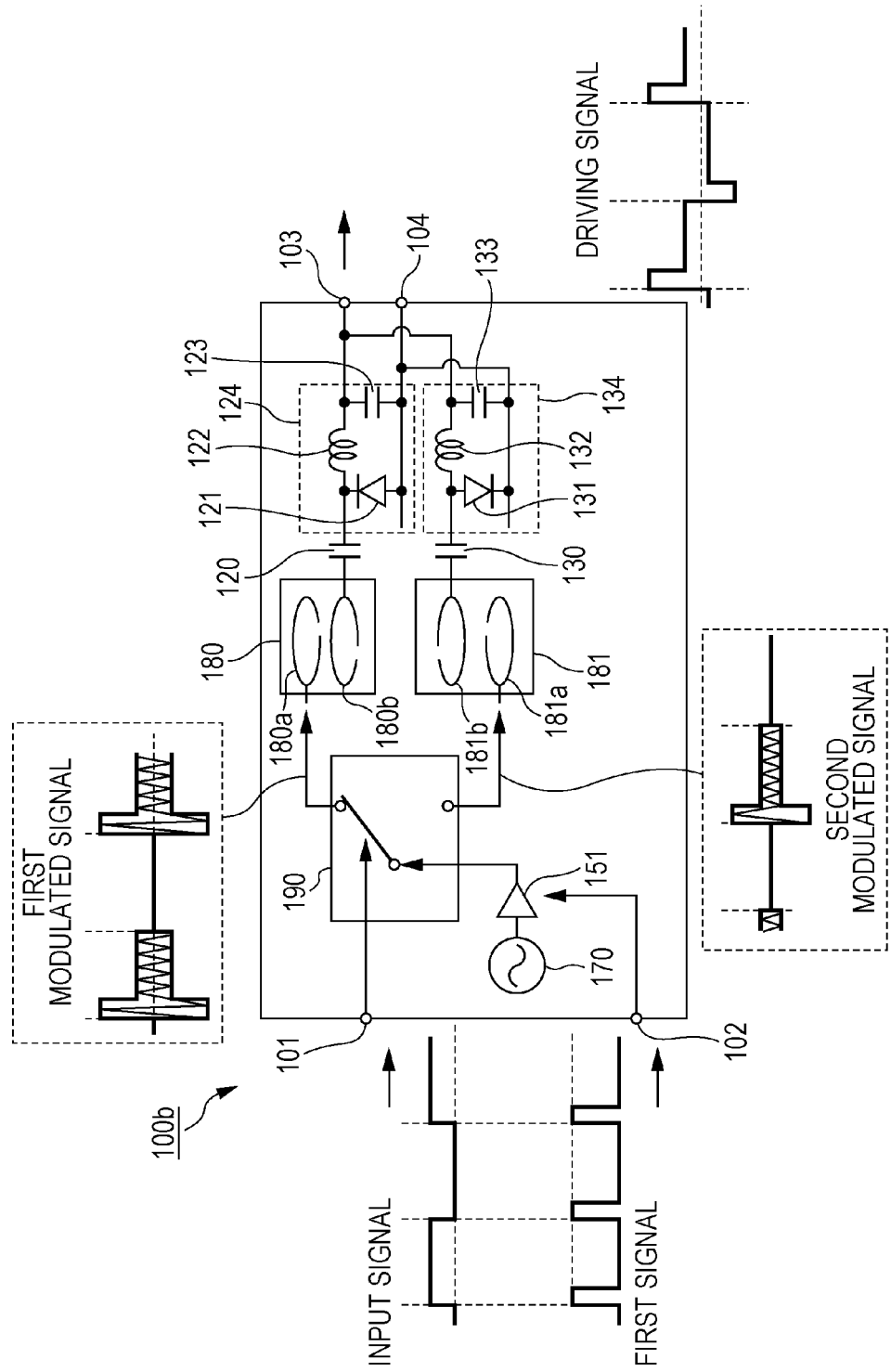
FIG. 9 illustrates an example of the structure of a gate drive circuit that includes a switch.

FIG. 9 illustrates an example of the structure of a gate drive circuit that includes a switch circuit instead of the mixer circuit 160.

A switch circuit 190 illustrated in FIG. 9 is a so-called single-pole double-throw (SPDT) switch. The switch circuit 190 receives a radio-frequency wave from the first amplifier circuit 151, and then output it to the destination selected by an input signal. For example, when the input signal has a high-level voltage value, the switch circuit 190 outputs the radio-frequency wave to the first electromagnetic resonant coupler 180; when the input signal has a low-level voltage value, the switch circuit 190 outputs the radio-frequency wave to the second electromagnetic resonant coupler 181.

In other words, the switch circuit 190 generates the first modulated signal by outputting the radio-frequency wave in a period in which the input signal takes a high-level voltage value. The first modulated signal generated by the switch circuit 190 is entered into the first electromagnetic resonant coupler 180. The switch circuit 190 also generates the second modulated signal by outputting the radio-frequency wave in a period in which the input signal takes a low-level voltage value. The second modulated signal generated by the switch circuit 190 is entered into the second electromagnetic resonant coupler 181.

The gate drive circuit 100a structured as described above can operate in the same way as the gate drive circuit 100.

The gate drive circuits 100, 100a, and 100b may lack the gain input terminal 102, through which the first signal is acquired from the outside. The gate drive circuits 100, 100a, and 100b may internally generate the first signal. For example, the gate drive circuits 100, 100a, and 100b may include a differential circuit that generates the first signal by differentiating an input signal. The structure of this type of differential circuit will be described in a second embodiment. The differential circuit is an example of the first circuit, which generates the first signal from an input signal entered into the input terminal 101.

The radio-frequency oscillator 170 in the gate drive circuits 100, 100a, and 100b is not always a mandatory constituent element. The first amplifier circuit 151 may acquire a radio-frequency wave from the outside of the gate drive circuit.

So far, examples in which the gate drive circuits 100, 100a, and 100b include an electromagnetic resonant coupler or two electromagnetic resonant couplers have been described. However, they may include an isolator, other than an electromagnetic resonant coupler, that can isolatedly transmit a radio-frequency wave.

The gate drive circuits gate drive circuits 100 and 100b have been described as having two electromagnetic resonant couplers. Alternately, they may include a single electromagnetic resonant coupler that can isolatedly and individually transmit two radio-frequency waves, instead of the two electromagnetic resonant couplers. For example, the gate drive circuits 100 and 100b may include a single two-input, two-output electromagnetic resonant coupler that has the functions of both the first electromagnetic resonant coupler 180 and the second electromagnetic resonant coupler 181.

Second Embodiment

In the first embodiment, the first amplifier circuit 151 has acquired the first signal from the outside of the gate drive circuit through the gain input terminal 102. However, it is also possible to generate the first signal synchronous with an input signal in a gate drive circuit.

In the first embodiment, a radio-frequency wave has been modulated according to the first signal and has been then further modulated according to an input signal. However, a radio-frequency wave may be modulated according to an input signal and may be then further modulated by the first signal.

A gate drive circuit according to second embodiment will be described below, focusing on differences from the gate drive circuit 100. Descriptions of the same constituent elements as in the gate drive circuit 100 may be omitted.

The gate drive circuit according to the second embodiment includes a modulated signal generation circuit that generates a first modulated signal by modulating a radio-frequency wave, a first isolator that isolatedly transmits the first modulated signal, and a first rectifier circuit that generates a first output signal by rectifying the first modulated signal. The modulated signal generation circuit includes, for example, a modulator circuit that generates a first partially modulated signal by modulating a radio-frequency wave according to an input signal entered into an input terminal and a first amplifier circuit that generates the first modulated signal by increasing the amplitude of the first partially modulated signal in a first amplifying period.

Figure 10:
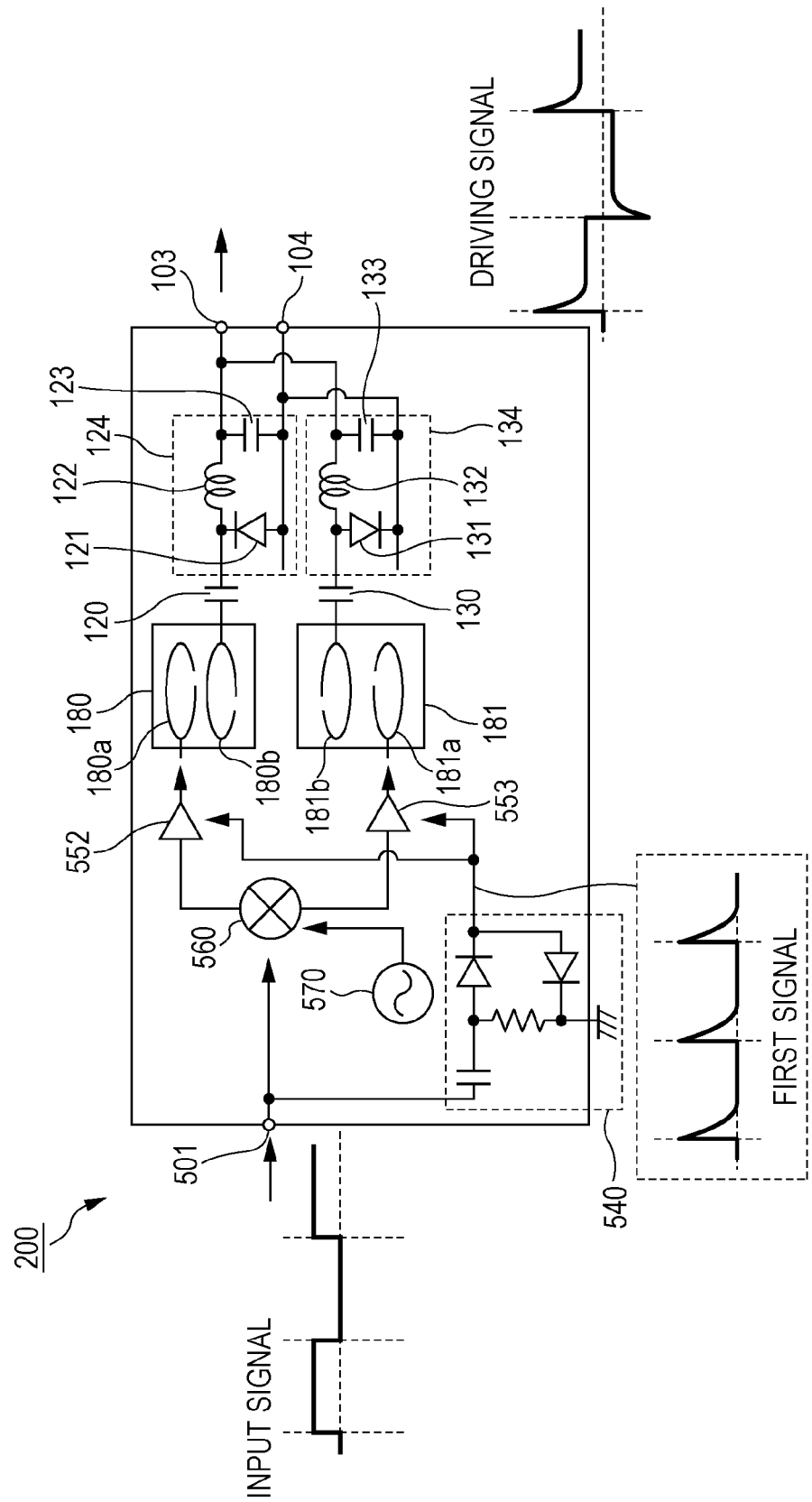
FIG. 10 illustrates an example of the structure of a gate drive circuit according to a second embodiment.

FIG. 10 illustrates an example of the structure of a gate drive circuit according to a second embodiment.

As illustrated in FIG. 10, the gate drive circuit 200 includes an input terminal 501, a radio-frequency oscillator 570, a mixer circuit 560, a first amplifier circuit 552, a second amplifier circuit 553, a first electromagnetic resonant coupler 180, a second electromagnetic resonant coupler 181, a first rectifier circuit 124, a second rectifier circuit 134, an output terminal 103, and an output reference terminal 104. The gate drive circuit 200 also includes an input capacitor 120, an input capacitor 130, and a differential circuit 540. The mixer circuit 560 is an example of modulator circuit.

An input signal is entered into the input terminal 501.

The differential circuit 540 differentiates the input signal entered into the input terminal 501 to generate a first signal, which indicates a target period. For example, the differential circuit 540 includes a capacitor, a resistor, and a pair of diodes. The input signal entered into the differential circuit 540 is differentiated by the capacitor and resistor and then undergoes full-wave rectification by the pair of diodes connected in parallel. Accordingly, the differential circuit 540 outputs the first signal having a waveform as illustrated in FIG. 10 to the first amplifier circuit 552 and second amplifier circuit 553.

In the example in FIG. 10, the first signal specifies, for example, a period immediately after a rising edge of the input signal and a period immediately after a falling edge of the input signal, as target periods. In this case, the target period is, for example, a period from a time at which a voltage value is rapidly raised until the voltage value falls to a prescribed value, or a period from a time at which a voltage value is rapidly fallen until the voltage value rises to a prescribed value.

The radio-frequency oscillator 570 generates a radio-frequency wave and then outputs the radio-frequency wave to the mixer circuit 560.

The mixer circuit 560 generates a third modulated signal by modulating the radio-frequency wave according to the input signal entered into the input terminal 501. The mixer circuit 560 also generates a fourth modulated signal by modulating the radio-frequency wave according to a signal obtained by inverting the input signal entered into the input terminal 501.

The first amplifier circuit 552 generates the first modulated signal by amplifying the amplitude of the third modulated signal in the target period indicated by the first signal output from the differential circuit 540 up to a value larger than the amplitude of the third modulated signal in a non-target period.

The second amplifier circuit 553 generates a second modulate signal by amplifying the amplitude of the fourth modulated signal in the target period indicated by the first signal output from the differential circuit 540 up to a value larger than the amplitude of the fourth modulated signal in a non-target period.

The third modulated signal may be also referred to as the first partially modulated signal, and the fourth modulated signal may be also referred to as the second partially modulated signal. The period in which the second amplifier circuit 553 amplifies the amplitude of the radio-frequency wave may be also referred to as the second amplification period, which is an example of the target period. The first modulated signal includes a first amplitude, a second amplitude, which is larger than the first amplitude, and a third amplitude, which is larger than the second amplitude. When the first partially modulated signal is amplified by the first amplifier circuit 552, the amplitude of the first partially modulated signal in the target period becomes the third amplitude of the first modulated signal, which is a large absolute voltage value. The second modulated signal includes a fourth amplitude, a fifth amplitude, which is larger than the fourth amplitude, and a sixth amplitude, which is larger than the fifth amplitude. When the second partially modulated signal is amplified by the second amplifier circuit 553, the amplitude of the second partially modulated signal in the target period becomes the sixth amplitude of the second modulated signal, which is a large absolute voltage value.

The operations and functions of the input capacitor 120, input capacitor 130, first electromagnetic resonant coupler 180, second electromagnetic resonant coupler 181, first rectifier circuit 124, and second rectifier circuit 134 provided in the gate drive circuit 200 are the same as in the gate drive circuit 100.

As a result, a driving signal having a voltage waveform as illustrated in FIG. 10 is output from the output terminal 103 and output reference terminal 104.

In the example in FIG. 10, the driving signal includes part of the first output signal and part of the second output signal.

For example, the driving signal includes a second output voltage value and third output voltage value of the first output signal, and also includes a fifth output voltage value and sixth output voltage value of the second output signal. In the driving signal in the example in FIG. 10, a period in which a voltage value is positive may be referred to as an on period and a period in which a voltage value is negative may be referred to as an off period. Then, the driving signal takes the third output voltage value, which has a positive polarity and a large absolute value, in a first on period, which begins after a switchover from an off period to an on period. In a second on period, which follows the first on period, the driving signal takes the second output voltage value, which has a negative polarity and a small absolute value. During a change from the third output voltage value to the second output voltage value, the absolute value of the voltage is gradually decreasing. The driving signal takes the sixth output voltage value, which has a negative polarity and a large absolute value, in a first off period, which begins after a switchover from an on period to an off period. In a second off period, which follows the first off period, the driving signal takes the fifth output voltage value, which has a negative polarity and a small absolute value. During a change from the sixth output voltage value to the fifth output voltage value, the absolute value of the voltage is gradually decreasing.

In this structure, the first signal synchronous to an input signal is generated with the differential circuit 540. Therefore, simply by entering an input signal into the input terminal 501, a driving signal having a voltage waveform close to the voltage waveform illustrated in (a) in FIG. 3 can be generated.

The first circuit, which generates the first signal, may have any circuit structure if it can generate the first signal indicating a target period from an input signal. That is, the first circuit, which generates the first signal, is not limited to a structure such as of the differential circuit 540.

As in the first embodiment, in the gate drive circuit 200, the second amplifier circuit 553, second electromagnetic resonant coupler 181, input capacitor 130, and second rectifier circuit 134 are not always mandatory constituent elements.

Although, in the example in FIG. 10, the gate drive circuit 200 includes the radio-frequency oscillator 570, the radio-frequency oscillator 570 is not always a mandatory constituent element. The mixer circuit 560 may acquire a radio-frequency wave from the outside of the gate drive circuit 200.

As in the first embodiment, in the gate drive circuit 200, a switch circuit may be used instead of the mixer circuit 560.

Third Embodiment

In the first embodiment, the gate drive circuit 100 has included any one of the mixer circuit 160 and switch circuit 190. However, a structure is also possible in which the gate drive circuit 100 includes neither the mixer circuit 160 nor the switch circuit 190.

A gate drive circuit, according to a third embodiment will be described below, focusing on differences from the gate drive circuit 100. Descriptions of the same constituent elements as in the gate drive circuit 100 may be omitted.

The gate drive circuit according to the third embodiment includes a modulated signal generation circuit that generates a first modulated signal by modulating a radio-frequency wave, a first isolator that isolatedly transmits the first modulated signal, and a first rectifier circuit that generates a first output signal by rectifying the first modulated signal. The modulated signal generation circuit includes, for example, a first amplifier circuit that generates a first modulated signal by increasing the amplitude of a radio-frequency wave according to a first input signal. The modulated signal generation circuit also includes, for example, a second amplifier circuit that generates a second modulated signal by increasing the amplitude of a radio-frequency wave according to a second input signal.

FIG. 11 illustrates an example of the structure of a gate drive circuit according to a third embodiment.

As illustrated in FIG. 11, the gate drive circuit 300 includes a first input terminal 605, a second input terminal 606, a radio-frequency oscillator 670, a first amplifier circuit 652, and a second amplifier circuit 653. The gate drive circuit 300 also includes a first electromagnetic resonant coupler 180, a second electromagnetic resonant coupler 181, a first rectifier circuit 124, a second rectifier circuit 134, an output terminal 103, and an output reference terminal 104. The gate drive circuit 300 also includes an input capacitor 120 and an input capacitor 130.

The first input signal, which controls a semiconductor switching element, is entered into the first input terminal 605.

The second input signal, which controls the semiconductor switching element, is entered into the second input terminal 606.

The radio-frequency oscillator 670 generates a radio-frequency wave and then outputs the radio-frequency wave to the first amplifier circuit 652 and second amplifier circuit 653.

The first amplifier circuit 652 generates the first modulated signal by amplifying the amplitude of the radio-frequency wave acquired from the radio-frequency oscillator 670, according to the first input signal entered into the first input terminal 605.

The second amplifier circuit 653 generates the second modulated signal by amplifying the amplitude of the radio-frequency wave acquired from the radio-frequency oscillator 670, according to the second input signal entered into the second input terminal 606.

The operations and functions of the input capacitor 120, input capacitor 130, first electromagnetic resonant coupler 180, second electromagnetic resonant coupler 181, first rectifier circuit 124, and second rectifier circuit 134 provided in the gate drive circuit 300 are the same as in the gate drive circuit 100.

The first input signal and second input signal have been set so as to obtain a driving signal having the voltage waveform as illustrated in (a) in FIG. 3. The first input signal and second input signal each take three voltage values.

The first input signal includes a first input voltage value, a second input voltage value, which is larger than the first input voltage value, and a third input voltage value, which is larger than the second input voltage value. The second input signal includes a fourth input voltage value, a fifth input voltage value, which is larger than the fourth input voltage value, and a sixth input voltage value, which is larger than the fifth input voltage value. In the example in FIG. 11, the first input signal and second input signal have similar voltage waveforms. For simplicity in the description below, therefore, the first input voltage value, second input voltage value, and third input voltage value of the first input signal may be respectively referred to as the first voltage value, second voltage value, and third voltage value of the first input signal. The fourth input voltage value, fifth input voltage value, and sixth input voltage value of the second input signal may be respectively referred to below as the first voltage value, second voltage value, and third voltage value of the second input signal. The first input signal and second input signal may have different voltage waveforms.

In the example in FIG. 11, the first input signal and second input signal each includes at least the first input voltage value, the second input voltage value, which is larger than the first input voltage value, and the third input voltage value, which is larger than the second input voltage value.

The first input signal takes the third voltage value, which is the largest among the three voltage values, in a first on period. The on period, for example, corresponds to a period in which the input signal is at a high level in a conventional gate drive circuit that uses a two-valued input signal to drive a semiconductor switching element. In the example in FIG. 11, the first on period is an initial period within an on period; however, this is not a limitation.

The first input signal takes the second voltage value in a second on period other than the first on period, within the on period. That is, in the example in FIG. 11, on period includes the first on period and the second on period, which follows the first on period.

The first input signal also takes the first voltage value, which is the smallest among the three voltage values, in an off period, in which the semiconductor switching element is in off state. The off period, for example, corresponds to a period in which the input signal is at a low level in a conventional gate drive circuit that uses a two-valued input signal to drive a semiconductor switching element.

The second input signal takes the third voltage value, which is the largest among the three voltage values, in a first off period. In the example in FIG. 11, the first off period is an initial period within an off period; however, this is not a limitation.

The second input signal takes the second voltage value in a second off period other than the first off period, within the off period. That is, in the example in FIG. 11, off period includes the first off period and the second off period, which follows the first off period.

The second input signal also takes the first voltage value, which is the smallest among the three voltage values, in an on period.

As a result, the first amplifier circuit 652 and second amplifier circuit 653 respectively output the first modulated signal and second modulated signal, which have voltage waveforms as illustrated in FIG. 4.

When the first modulated signal and second modulated signal are rectified, the first output signal and second output signal, which voltage waveforms as illustrated in FIG. 4, are obtained. As a result, a driving signal having a voltage waveform as illustrated in FIG. 4 is obtained.

That is, the gate drive circuit 300 can rapidly change the voltage values of a driving signal to given values as with the gate drive circuits 100, 100*a,* 100*b,* and 200.

The first input signal and second input signal may be generated in a circuit in the gate drive circuit 300.

As with the gate drive circuit 100*a,* in the gate drive circuit 300, the second amplifier circuit 553, second electromagnetic resonant coupler 181, input capacitor 130, and second rectifier circuit 134 are not always mandatory constituent elements. In the gate drive circuit 300, the radio-frequency oscillator 670 is not always a mandatory constituent element. The first amplifier circuit 652 and second amplifier circuit 653 may acquire a radio-frequency signal from the outside of the gate drive circuit 300.

Other Embodiments

So far, the gate drive circuits according to the first to third embodiments have been described.

The gate drive circuits according to the first to third embodiments can generate a driving signal having a given voltage waveform and can apply the generated driving signal to a switching element. If these gate drive circuits include electromagnetic resonant couplers as the isolators, they can isolatedly transmit the signal from the primary side to the secondary side even when the voltage value of the signal rapidly changes.

A conventional gate drive circuit including electromagnetic resonant couplers selectively transmits a constant electric power. In this case, driving efficiency is low and much power is thereby consumed. In another conventional gate drive circuit including electromagnetic induction couplers, an isolated power supply unit and its peripheral circuits need to be provided on the secondary side. In this case, the circuit structure thereof becomes complex and driving efficiency is low.

By contrast, the gate drive circuits according to the first to third embodiments can change the amplitude of the radio-frequency signal on the primary side and then can isolatedly transmit the radio-frequency signal from the primary side to the secondary side. Therefore, the gate drive circuits according to the first to third embodiments can achieve high driving efficiency and can eliminate the need to provide a complex circuit on the secondary side. Specifically, the gate drive circuits according to the first to third embodiments can easily generate a driving signal that take three or more voltage values.

In other words, the gate drive circuits according to the first to third embodiments can generate a driving signal having a given voltage waveform. For example, these gate drive circuits can generate a driving signal that has a high voltage value in a prescribed period immediately after its rising edge and has a low voltage value in a prescribed period immediately after its falling edge, as described above with reference to (a) in FIG. 3. Thus, more efficient gate driving can be achieved with less power consumption than before. A switching waveform with noise reduced can also be generated.

Since the gate drive circuits according to the first to third embodiments can change the voltages value of the driving signal to given values as described above, they can also be applied to, for example, so-called soft switching control.

The circuit structures illustrated in the circuit drawings are only examples. The present disclosure is not limited to these circuit structures. That is, as with these circuit structures, circuits that can implement characteristic functions in the present disclosure are also included in the present disclosure. For example, a circuit is also included in the present disclosure in which a switching element (i.e., transistor), a resistive element, a capacitive element, or the like is connected in parallel to or in series with a certain element, within a range in which a function similar to one of the functions of the above circuit structures can be implemented. In other words, "connected" in the present disclosure is not limited to a connection in which two terminals are directly connected, but includes a connection in which the two terminals are connected with an element intervening therebetween within a range in which a similar function can be implemented.

Representations concerning input and output of a signal are not limited to a case in which the signal is directly entered and output, but include a case in which the signal is indirectly entered and output. For example, "a signal is output from A to B", "a signal is entered into B from A", "a signal is output from A and is entered into B", and other representations include a structure in which another element or circuit is present between A and B. These representations also include a case in which the signal output from A changes its form as a result of having passed through the other element or circuit and the signal in the changed form is entered into B.

The present disclosure is not limited to the embodiments described above and their variations. The range of the present disclosure includes embodiments in which various variations that a person having ordinary skill in the art thinks of are applied to the embodiments described above and their variations and also includes embodiments in which constituent elements in different embodiments or their variations are combined, without departing from the intended scope of the present disclosure.

For example, the gate drive circuit is a gate drive circuit that generates a driving signal that drives a semiconductor switching element. The gate drive circuit may include an input terminal into which an input signal used to drive the semiconductor switching element is entered, a first amplifier circuit that acquires a radio-frequency signal, increases the amplitude of the radio-frequency signal in a target period to a value larger than the amplitude of the radio-frequency signal in a non-target period, and outputs the radio-frequency signal having the increased amplitude, a modulator circuit that generates a first modulated signal in which the radio-frequency signal output from the first amplifier circuit has been modulated according to the input signal entered into the input terminal, a first electromagnetic resonant coupler that isolatedly transmits the first modulated signal, a first rectifier circuit that generates a first output signal demodulated by rectifying the first modulated signal that has been isolatedly transmitted by the first electromagnetic resonant coupler, and an output terminal and an output reference terminal, which are paired, to which a driving signal that includes at least the first output signal is output.

For example, the modulator circuit may further generate a second modulated signal in which the radio-frequency signal output from the first amplifier circuit has been modulated according to a signal generated by inverting the input signal entered into the input terminal; the gate drive circuit may further include a second electromagnetic resonant coupler that isolatedly transmits the second modulated signal and a second rectifier circuit that generates a second output signal demodulated by rectifying the second modulated signal that has been isolatedly transmitted by the second electromagnetic resonant coupler; and a driving signal including the first output signal and second output signal may be output to the output terminal and output reference terminal.

For example, the gate drive circuit is a gate drive circuit that generates a driving signal that drives a semiconductor switching element. The gate drive circuit may include an input terminal into which an input signal used to drive the semiconductor switching element is entered, a modulator circuit that acquires a radio-frequency signal and generates a third modulated signal in which the amplitude of the radio-frequency signal has been modulated according to the input signal entered into the input terminal, a first amplifier circuit that generates a first modulated signal in which the amplitude of the third modulated signal in a target period has been increased to a value larger than the amplitude of the third modulated signal in a non-target period, a first electromagnetic resonant coupler that isolatedly transmits the first modulated signal, a first rectifier circuit that generates a first output signal demodulated by rectifying the first modulated signal that has been isolatedly transmitted by the first electromagnetic resonant coupler, and an output terminal and an output reference terminal, which are paired, to which a driving signal that includes at least the first output signal is output.

For example, the modulator circuit may further generate a fourth modulated signal in which the radio-frequency signal has been modulated according to a signal generated by inverting the input signal entered into the input terminal; the gate drive circuit may further include a second amplifier circuit that generates a second modulated signal in which the amplitude of the fourth modulated signal in a target period has been increased to a value larger than the amplitude of the fourth modulated signal in a non-target period, a second electromagnetic resonant coupler that isolatedly transmits the second modulated signal, and a second rectifier circuit that generates a second output signal demodulated by rectifying the second modulated signal that has been isolatedly transmitted by the second electromagnetic resonant coupler; and a driving signal including the first output signal and second output signal may be output to the output terminal and output reference terminal.

For example, the target period may be at least one of a prescribed period immediately after a rising edge of the input signal entered into the input terminal and an a prescribed period immediately after the falling edge of the input signal.

For example, the gate drive circuit may further include a first circuit that generates a first signal, which indicates a target period, from the input signal entered into the input terminal and outputs the first signal to the first amplifier circuit.

For example, the gate drive circuit may further include a first circuit that generates a first signal, which indicates a target period, from the input signal entered into the input terminal and outputs the first signal to the first amplifier circuit and second amplifier circuit.

For example, the first circuit may be a differential circuit that differentiates the input signal.

For example, the gate drive circuit may further include a gain input terminal into which the first signal, which indicates a target period, is entered and the first amplifier circuit may acquire the first signal from the gain input terminal.

For example, the gate drive circuit may further include a gain input terminal into which the first signal, which indicates a target period, is entered, and the first amplifier circuit and second amplifier circuit each may acquire the first signal from the gain input terminal.

For example, the gate drive circuit may further include a radio-frequency oscillator that generates a radio-frequency signal to be acquired by the modulator circuit.

For example, the modulated circuit may be a mixer circuit that generates the first modulated signal by mixing the input signal entered into the input terminal and the radio-frequency signal output from the first amplifier circuit.

For example, the modulating signal may be a switch circuit that generates the first modulated signal by outputting the radio-frequency signal according to the input signal entered into the input terminal, the radio-frequency signal being output from the first amplifier circuit.

For example, if the input signal entered into the input terminal takes two voltage values, the driving signal may take three or more voltage values.

For example, the gate drive circuit is a gate drive circuit that generates a driving signal that drives a semiconductor switching element. The gate drive circuit may include a first input terminal into which a first input signal used to drive the semiconductor switching element is entered, a first amplifier circuit that acquires a radio-frequency signal and generates a first modulated signal in which the amplitude of the radio-frequency signal has been increased according to the first input signal entered into the first input terminal, a first electromagnetic resonant coupler that isolatedly transmits the first modulated signal, a first rectifier circuit that generates a first output signal demodulated by rectifying the first modulated signal that has been isolatedly transmitted by the first electromagnetic resonant coupler, and an output terminal and an output reference terminal, which are paired, to which a driving signal that includes at least the first output signal is output.

For example, the gate drive circuit may further include a second input terminal into which a second input signal used to drive the semiconductor switching element is entered, a second amplifier circuit that acquires a radio-frequency signal and generates a second modulated signal in which the amplitude of the radio-frequency signal has been increased according to the second input signal entered into the second input terminal, a second electromagnetic resonant coupler that isolatedly transmits the second modulated signal, and a second rectifier circuit that generates a second output signal demodulated by rectifying the second modulated signal that has been isolately transmitted by the second electromagnetic resonant coupler; and a driving signal including the first output signal and second output signal may be output to the output terminal and output reference terminal.

For example, the first second signal and second input signal each may include at least a first input voltage value, a second input voltage value, which is larger than the first input voltage value, and a third input voltage value, which is larger than the second input voltage value. The first input signal may take the third output voltage value in a first on period, in each of which the semiconductor switching element is turned on, may take the second voltage value in a second on period other than the first on period, and may take the first voltage value in an off period, in which the semiconductor switching element is turned off. The second input signal may take the third output voltage value in a first off period, in each of which the semiconductor switching element is turned off, may take the second voltage value in a second off period other than the first off period, and may take the first voltage value in an on period.

For example, on period may include the first on period and the second on period that follows the first on period, and off period may include the first off period and the second off period, which follows the first off period.

The gate drive circuit according to the present disclosure is useful as a gate drive circuit that drives a semiconductor switching element.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A gate drive circuit comprising:
a modulated signal generation circuit that modulates a radio-frequency wave, to generate a first modulated signal including a first amplitude, a second amplitude larger than the first amplitude, and a third amplitude larger than the second amplitude;
a first isolator that isolately transmits the first modulated signal;
a first rectifier circuit that rectifies the first modulated signal which has been transmitted by the first isolator, to generate a first output signal including a first output voltage value according to the first amplitude, a second output voltage value according to the second amplitude, and a third output voltage value according to the third amplitude; and
an output terminal through which a driving signal is output to a semiconductor switch, the driving signal including at least part of the first output signal.

2. The gate drive circuit according to claim 1, wherein the driving signal takes three or more voltage values including the second output voltage value and the third output voltage value.

3. The gate drive circuit according to claim 1, wherein the driving signal takes the third output voltage value in a first on period, which begins when the semiconductor switch is turned on, and takes the second output voltage value in a second on period, which follows the first on period.

4. The gate drive circuit according to claim 1, wherein the modulated signal generation circuit modulates the radio-frequency wave, further to generate a second modulated signal including a fourth amplitude, a fifth amplitude larger than the fourth amplitude, and a sixth amplitude larger than the fifth amplitude,
the gate drive circuit further comprises:
a second isolator that isolately transmits the second modulated signal; and
a second rectifier circuit that rectifies the second modulated signal which has been transmitted by the second isolator, to generate a second output signal including a fourth output voltage value according to the fourth amplitude, a fifth output voltage value according to the fifth amplitude, and a sixth output voltage value according to the sixth amplitude, and
the driving signal further includes at least part of the second output signal.

5. The gate drive circuit according to claim 4, wherein the driving signal further includes the second output voltage value, the third output voltage value, the fifth output voltage value, and the sixth output voltage value.

6. The gate drive circuit according to claim 4, wherein the driving signal takes the sixth output voltage value in a first off period, which begins when the semiconductor switch is turned off, and takes the fifth output voltage value in a second off period, which follows the first off period.

7. The gate drive circuit according to claim 1, wherein the modulated signal generation circuit modulates the radio-frequency wave to generate a first partially modulated signal and then modulates the first partially modulated signal to generate the first modulated signal.

8. The gate drive circuit according to claim 1, wherein the modulated signal generation circuit includes:
a first amplifier circuit that amplifies part of an amplitude of the radio-frequency wave in a first amplifying period, to generate a first partially modulated signal; and
a modulator circuit that modulates the first partially modulated signal on the basis of an input signal, to generate the first modulated signal.

9. The gate drive circuit according to claim 8, wherein the modulator circuit further modulates the first partially modulated signal on the basis of an inversion signal of the input signal, to generate a second modulated signal,
the gate drive circuit further comprises a second isolator that isolately transmits the second modulated signal, and a second rectifier circuit that rectifies the second modulated signal which has been transmitted by the second isolator, to generate a second output signal, and
the driving signal further includes at least part of the second output signal.

10. The gate drive circuit according to claim 1, wherein the modulated signal generation circuit includes:
a modulator circuit that modulates the radio-frequency wave on the basis of an input signal to generate a first partially modulated signal, and
a first amplifier circuit that amplifies part of an amplitude of the first partially modulated signal in a first amplifying period, to generate the first modulated signal.

11. The gate drive circuit according to claim 10, wherein the modulator circuit that modulates the radio-frequency wave on the basis of an inversion signal of the input signal, to generate a second partially modulated signal,
the modulator circuit further includes a second amplifier circuit that amplifies part of an amplitude of the second partially modulated signal in a second amplifying period, to generate a second modulated signal, the gate drive circuit further comprises a second isolator that isolatedly transmits the second modulated signal, and a second rectifier circuit that rectifies the second modulated signal which has been transmitted by the second isolator, to generate a second output signal, and the driving signal further includes at least part of the second output signal.

12. The gate drive circuit according to claim 1, wherein the modulated signal generation circuit modulates the radio-frequency wave on the basis of a first input signal, to generate the first modulated signal,
the first input signal includes a first input voltage value, a second input voltage value larger than the first input voltage value, and a third input voltage value larger than the second input voltage value, and
the first modulated signal includes the first amplitude according to the first input voltage value, the second amplitude according to the second input voltage value, and the third amplitude according to the third input voltage value.

13. The gate drive circuit according to claim 12, wherein the modulated signal generation circuit includes a first amplifier circuit that modulates the radio-frequency wave by amplifying part of an amplitude of the radio-frequency wave on the basis of the first input signal, to generate the first modulated signal.

14. The gate drive circuit according to claim 12, wherein the modulated signal generation circuit further modulates the radio-frequency wave on the basis of a second input signal, to generate a second modulated signal,
the gate drive circuit further comprises a second isolator that isolatedly transmits the second modulated signal, and a second rectifier circuit that rectifies the second modulated signal which has been transmitted by the second isolator, to generate a second output signal,
the second input signal includes a fourth input voltage value, a fifth input voltage value larger than the fourth input voltage value, and a sixth input voltage value larger than the fifth input voltage value,
the second modulated signal includes a fourth amplitude according to the fourth input voltage value, a fifth amplitude according to the fifth input voltage value, and a sixth amplitude according to the sixth input voltage value,
the second output signal includes a fourth output voltage value according to the fourth amplitude, a fifth output voltage value according to the fifth amplitude, and a sixth output voltage value according to the sixth amplitude, and the driving signal further includes at least part of the second output signal.

15. The gate drive circuit according to claim 14, wherein the modulated signal generation circuit further includes:
a first amplifier circuit that modulates the radio-frequency wave by amplifying part of an amplitude of the radio-frequency wave on the basis of the first input signal, to generate the first modulated signal; and
a second amplifier circuit that modulates the radio-frequency wave by amplifying part of an amplitude of the radio-frequency wave on the basis of the second input signal, to generate the second modulated signal.

16. The gate drive circuit according to claim 8, further comprising a first circuit that generates a first signal from the input signal, wherein
the first amplifying period is specified by the first signal.

17. The gate drive circuit according to claim 10, further comprising a first circuit that generates a first signal from the input signal, wherein
the first amplifying period is specified by the first signal.

18. The gate drive circuit according to claim 16, wherein the first circuit includes a differential circuit that differentiates the input signal.

19. The gate drive circuit according to claim 1, wherein the modulated signal generation circuit further includes a radio-frequency oscillator that generates the radio-frequency wave.

20. The gate drive circuit according to claim 1, wherein the first isolator is an electromagnetic resonant coupler.

* * * * *